US012396189B2

(12) United States Patent
Kubouchi

(10) Patent No.: US 12,396,189 B2
(45) Date of Patent: Aug. 19, 2025

(54) SEMICONDUCTOR DEVICE AND METHOD OF MANUFACTURING THE SAME

(71) Applicant: FUJI ELECTRIC CO., LTD., Kawasaki (JP)

(72) Inventor: Motoyoshi Kubouchi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 427 days.

(21) Appl. No.: 18/089,236

(22) Filed: Dec. 27, 2022

(65) Prior Publication Data

US 2023/0261094 A1    Aug. 17, 2023

(30) Foreign Application Priority Data

Feb. 17, 2022    (JP) .................................. 2022-022943

(51) Int. Cl.
*H10D 12/00* (2025.01)
*H10D 8/00* (2025.01)
*H10D 12/01* (2025.01)
*H10D 64/27* (2025.01)

(52) U.S. Cl.
CPC ............. *H10D 12/481* (2025.01); *H10D 8/00* (2025.01); *H10D 12/01* (2025.01); *H10D 64/513* (2025.01)

(58) Field of Classification Search
CPC .. H10D 12/481; H10D 12/441; H10D 12/461; H10D 8/00; H10D 8/422; H10D 84/811; H10D 62/141; H01L 21/76802
See application file for complete search history.

(56) References Cited

U.S. PATENT DOCUMENTS

| 10,439,034 | B2 | 10/2019 | Hasegawa et al. |
| 11,043,555 | B2 | 6/2021 | Yoshida |
| 11,195,749 | B2 | 12/2021 | Kato et al. |
| 11,257,910 | B2 | 2/2022 | Kubouchi |
| 2001/0003671 | A1 | 6/2001 | Oguro |
| 2002/0096726 | A1 | 7/2002 | Koike |
| 2008/0124915 | A1 | 5/2008 | Yamaguchi |
| 2015/0008478 | A1 | 1/2015 | Cheng et al. |
| 2019/0096989 | A1 | 3/2019 | Yoshida |
| 2019/0165119 | A1 | 5/2019 | Hasegawa et al. |
| 2020/0020579 | A1* | 1/2020 | Kato ..................... H10D 12/038 |
| 2020/0357903 | A1* | 11/2020 | Kubouchi ................ H10D 8/00 |

(Continued)

FOREIGN PATENT DOCUMENTS

| JP | 4-320329 A | 11/1992 |
| JP | 11-121396 A | 4/1999 |

(Continued)

*Primary Examiner* — Wasiul Haider

(57) ABSTRACT

A semiconductor device includes: a semiconductor substrate; a plurality of trenches provided on a top surface side of the semiconductor substrate; am insulated gate electrode structure buried inside the respective trenches; an interlayer insulating film deposited on top surfaces of the semiconductor substrate and the insulated gate electrode structure; and a silicide layer deposited at a bottom of a contact hole penetrating the interlayer insulating film so as to be in contact with the top surface of the semiconductor substrate interposed between the trenches adjacent to each other, wherein at least a part of a bottom surface of the silicide layer is located at a higher position than a bottom surface of the interlayer insulating film.

18 Claims, 17 Drawing Sheets

(56) References Cited

U.S. PATENT DOCUMENTS

2021/0111253 A1    4/2021   Kubouchi
2021/0273043 A1    9/2021   Yoshida
2022/0084880 A1    3/2022   Kato et al.

FOREIGN PATENT DOCUMENTS

| | | |
|---|---|---|
| JP | 2002-198325 A | 7/2002 |
| JP | 2007-335554 A | 12/2007 |
| JP | 2011-181840 A | 9/2011 |
| JP | 2013-175707 A | 9/2013 |
| JP | 2019-96848 A | 6/2019 |
| JP | 2019-114705 A | 7/2019 |
| JP | 2020-13828 A | 1/2020 |
| JP | 2021-64673 A | 4/2021 |
| JP | 6950779 A | 9/2021 |
| WO | 2020/036015 A1 | 2/2020 |

\* cited by examiner

SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Application No. 2022-022943 filed on Feb. 17, 2022, the entire contents of which are incorporated by reference herein.

BACKGROUND OF THE INVENTION

1. Field of the Invention

The present invention relates to a semiconductor device and a method of manufacturing the semiconductor device.

2. Description of the Related Art

Conventional trench-gate metal-oxide-semiconductor field-effect transistors (MOSFETs) or insulated gate bipolar transistors (IGBTs) have a configuration in which an interlayer insulating film provided on a mesa part interposed between trenches adjacent to each other is provided with penetration holes (contact holes) so that the mesa part is exposed in order to connect the mesa part with a source electrode or an emitter electrode. A film of barrier metal including a titanium film and a titanium nitride film is deposited inside the contact holes, and the contact holes are further filled with a tungsten film. Thereafter, the source electrode or the emitter electrode is further deposited on the tungsten film. To prevent a spread of tungsten (W) of the tungsten film toward silicon (Si) of the mesa part and to enhance adhesiveness, the titanium film deposited at the bottom of the contact holes is subjected to silicidation to form a titanium silicide layer before the tungsten film is buried.

WO 2020/036015 A1 discloses a semiconductor device including a transistor part and a diode part, and having a life-time control region inside a semiconductor substrate. JP 2011-181840 A discloses a configuration in which a first metal film of barrier metal included in a front-surface electrode provided on the entire surface of a cell region provided with an IGBT is formed of metallic material of the VIII group such as nickel and cobalt. JP 2002-198325 A discloses a configuration in which contact holes are formed so that a silicon thin film and barrier metal are sequentially deposited or the barrier metal and the silicon thin film are sequentially deposited in the contact holes, and heat treatment is then executed so as to form silicide. JP H4-320329 A discloses forming a silicon layer on a semiconductor substrate at the bottom of a contact hole, forming a refractory metal silicide layer, and forming a metal film. JP H11-121396 A discloses forming a silicon film on a surface of a silicon layer, forming a titanium film on the silicon film, and reacting the silicon film and the titanium film by heat treatment to form a $TiSi_2$ film. JP 2013-175707 A discloses an irradiation step of irradiating a particle beam or radiation from a main surface side of a semiconductor substrate, and an annealing step for recovering crystal defects contained in a gate insulating film and a gate electrode after the irradiation step. JP2019-114705 A discloses forming a trench on a surface of a semiconductor substrate, hydrogen-terminating dangling bonds of atoms in an inner surface of the trench, forming a first insulating film and a second insulating film on the inner surface of the trench, and forming a gate electrode inside of the trench. JP 2020-013828 A discloses a semiconductor device including a semiconductor substrate, an interlayer insulating film disposed on an upper surface of the semiconductor substrate, a titanium layer provided on the interlayer insulating film, and a titanium nitride layer provided on the titanium layer. The interlayer insulating film has an opening that exposes a portion of the upper surface of the semiconductor substrate, and the titanium layer and the titanium nitride layer are also provided in the opening. The titanium layer that is arranged in contact with the semiconductor substrate at the bottom of the opening is entirely titanium silicided.

JP 2007-335554 A discloses forming a Ti film on a bottom surface and a side wall surface of a contact, forming a Ti silicide film on the bottom surface by annealing treatment, forming a TiN film on the bottom surface and side wall after removing an unreacted Ti film, phase transitioning the Ti silicide film by annealing treatment again, and depositing tungsten in a remaining space of the contact hole to form a tungsten plug. JP 2019-096848 A discloses a semiconductor device including a contact hole that penetrates an interlayer insulating layer and a gate insulating layer and the exposes part of the surface of a semiconductor substrate, a metal layer covering an upper surface of the interlayer insulating layer, an inner side surface of the contact hole, and the exposed part of the semiconductor substrate, and a source wiring connected through a contact hole to a part of the metal layer covering at least the exposed part of the surface of the semiconductor substrate. JP 2021-064673 A discloses a semiconductor device in which a lifetime control region including a lifetime killer is provided below a base region in a semiconductor substrate, extending from at least a portion of a transistor portion to a diode portion. JP 6950779 B discloses a semiconductor device in which an upper surface side lifetime reduction region is provided on an upper surface side of a semiconductor substrate in a diode section.

When the titanium film at the bottom of the contact holes is subjected to silicidation to form the titanium silicide layer, titanium (Ti) of the titanium film reacts with silicon (Si) in the mesa part, and the volume of the mesa part is thus decreased, which leads the contact holes to expand to a part under an interlayer insulating film, causing eaves (overhangs) in the interlayer insulating film. Such a case may impede the appropriate formation of the metal film such as a titanium nitride film or a tungsten film inside the contact holes after the formation of the titanium silicide layer. This may result in a spread of tungsten (W) of the tungsten film toward silicon (Si) in the mesa part.

SUMMARY OF THE INVENTION

In view of the foregoing problems, the present invention provides a semiconductor device and a method manufacturing the semiconductor device capable of satisfactorily forming a metal film inside a contact hole of an interlayer insulating film when forming a silicide layer at a bottom of the contact hole.

An aspect of the present invention inheres in a semiconductor device including: a semiconductor substrate; a plurality of trenches provided on a top surface side of the semiconductor substrate; am insulated gate electrode structure buried inside the respective trenches; an interlayer insulating film deposited on top surfaces of the semiconductor substrate and the insulated gate electrode structure; and a silicide layer deposited at a bottom of a contact hole penetrating the interlayer insulating film so as to be in contact with the top surface of the semiconductor substrate interposed between the trenches adjacent to each other, wherein at least a part of a bottom surface of the silicide layer is located at a higher position than a bottom surface of the interlayer insulating film.

Another aspect of the present invention inheres in a method of a semiconductor device including: digging a plurality of trenches from a top surface side of a semiconductor substrate; burying an insulated gate electrode structure in the respective trenches; depositing an interlayer insulating film on top surfaces of the semiconductor substrate and the insulated gate electrode structure; forming a contact hole in the interlayer insulating film located on the semiconductor substrate interposed between the respective trenches; and forming a silicide layer inside the contact hole such that at least a part of a bottom surface of the silicide layer is located at a higher position than a bottom surface of the interlayer insulating film.

DETAILED DESCRIPTION

Figure 1:
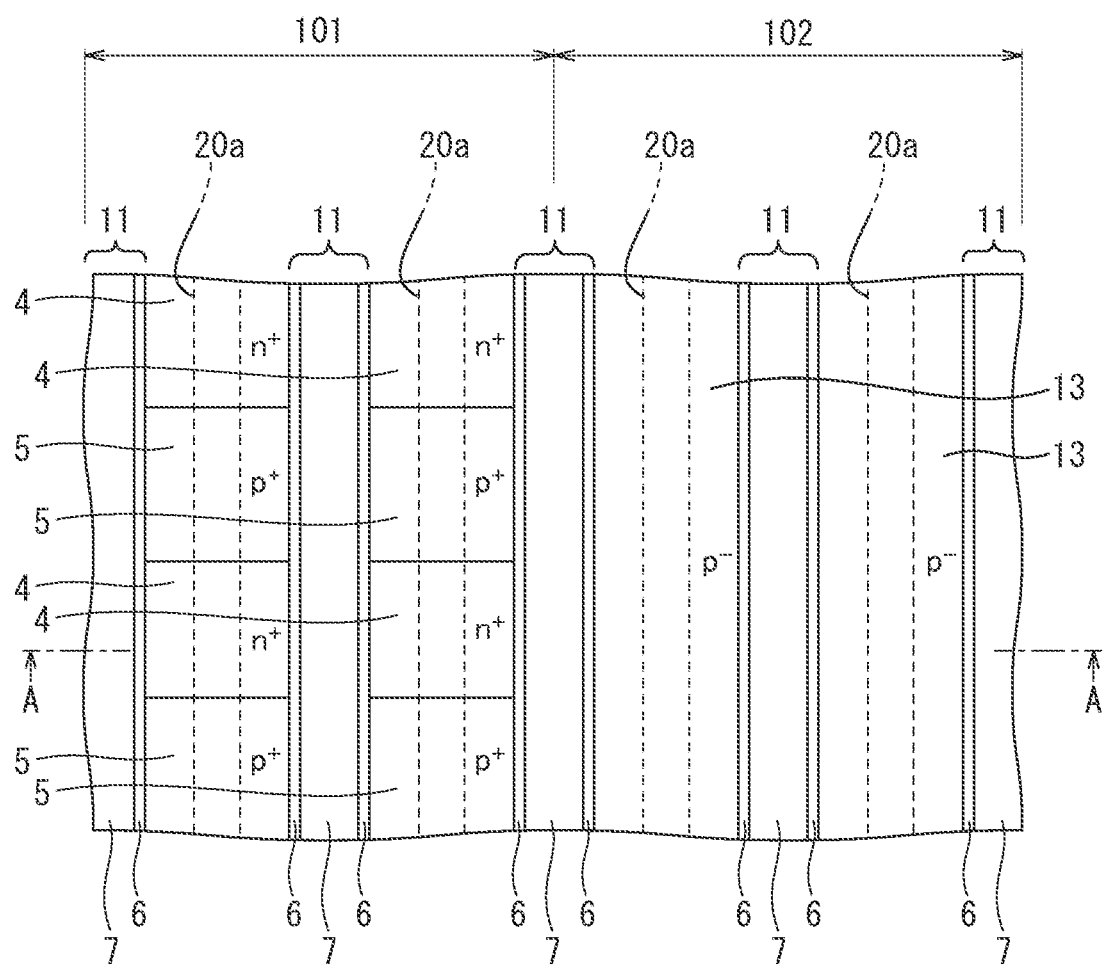
FIG. 1 is a plan view illustrating an example of a semiconductor device according to a first embodiment.

With reference to the Drawings, first and second embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

As used in the present specification, a source region of a MOSFET is "one main region (a first main region)" that can be used as an emitter region of an insulated gate bipolar transistor (IGBT). The "one main region", when provided in a thyristor such as a MOS controlled static induction thyristor (SI thyristor), can be used as a cathode region. A drain region of the MOSFET is "another main region (a second main region)" of the semiconductor device that can be used as a collector region in the IGBT and as an anode region in the SI thyristor. The term "main region", when simply mentioned in the present specification, is referred to as either the first main region or the second main region that is determined as appropriate by the person skilled in the art.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity type is an n-type and a second conductivity type is a p-type. However, the relationship of the conductivity types may be inverted to set the first conductivity type to the p-type and the second conductivity type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

First Embodiment

<Configuration of Semiconductor Device>

FIG. 1 is a plan view illustrating a part of an active region of a semiconductor device according to a first embodiment as viewed from the top surface (the front surface) side. As illustrated in FIG. 1, the semiconductor device according to the first embodiment includes a transistor part 101 including a transistor element such as an IGBT and a diode part 102 including a diode element, which are integrated on the same semiconductor chip. For example, the semiconductor device according to the first embodiment is a reverse-conducting IGBT (RC-IGBT) including an IGBT corresponding to the transistor part 101 and a free-wheeling diode (FWD) corresponding to the diode part 102 connected antiparallel to the IGBT that are integrated on the same semiconductor chip. The transistor part 101 and the diode part 102 may be arranged alternately in the right-left direction in FIG. 1.

Figure 2:
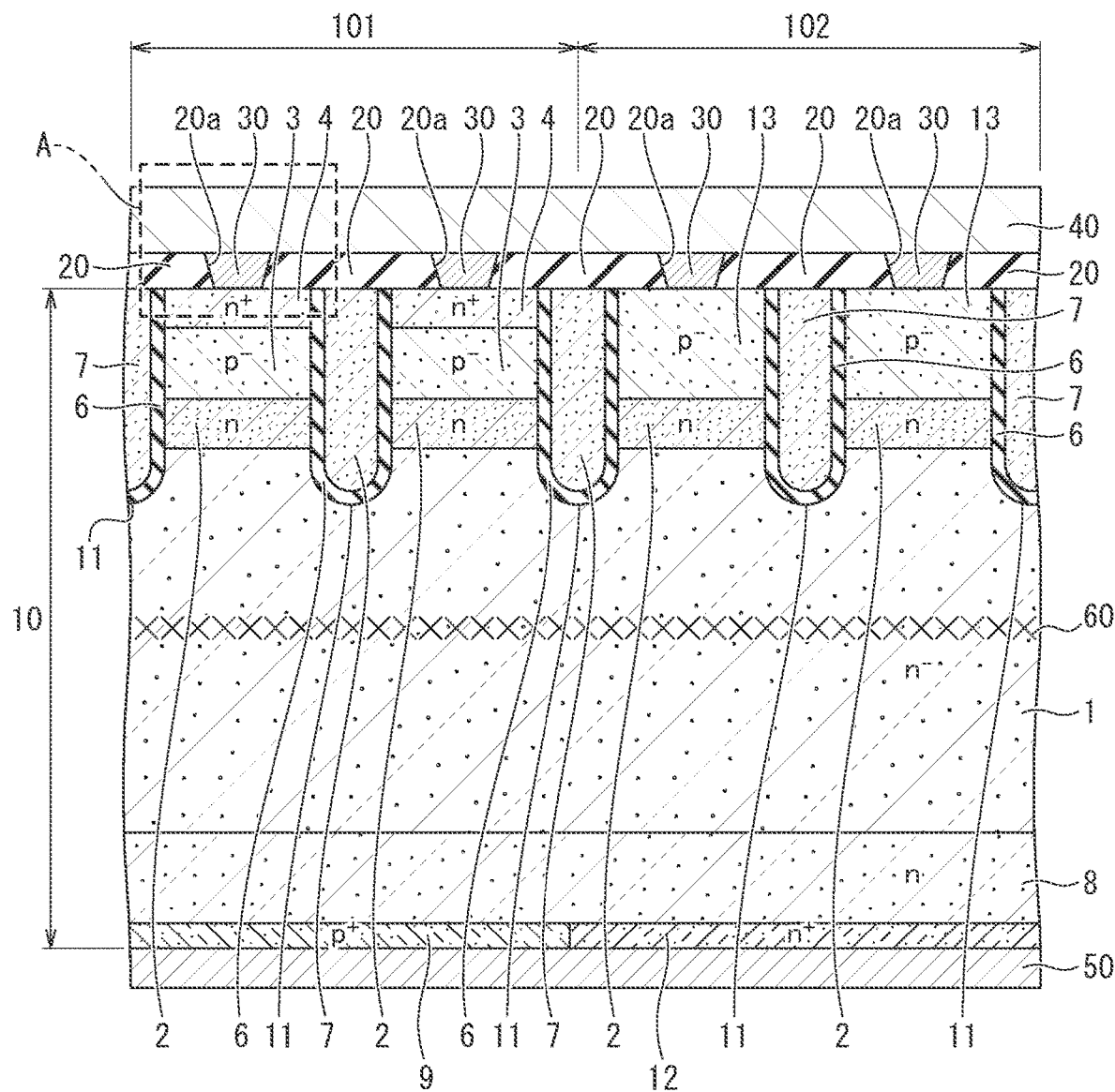
FIG. 2 is a cross-sectional view as viewed from A-A line in FIG. 1.

FIG. 2 is a cross-sectional view taken along line A-A cross-sectioned across the transistor part 101 and the diode part 102 in FIG. 1. As illustrated in FIG. 2, the semiconductor device according to the first embodiment includes a semiconductor substrate 10. The semiconductor substrate 10 is a silicon (Si) substrate, for example. The semiconductor substrate 10 is not limited to the Si substrate, and may be a semiconductor substrate of a semiconductor (a wide bandgap semiconductor) having a wider band gap than Si, such as silicon carbide (SiC), gallium nitride (GaN), diamond (C), or aluminum nitride (AlN).

The semiconductor substrate 10 includes a drift layer 1 of a first conductivity-type (n$^-$-type). An accumulation layer 2 of n-type is deposited on the top surface side of the drift layer 1 and having a higher impurity concentration than the drift layer 1 in the transistor part 101. The bottom surface of the accumulation layer 2 is in contact with the top surface of the drift layer 1. The presence of the accumulation layer 2 can enhance the effect of promoting the injection of carriers (an IE effect) so as to decrease an ON-voltage.

The transistor part 101 is provided with a base region 3 of a second conductivity-type (p$^+$-type) deposited on the top surface side of the accumulation layer 2. The bottom surface of the base region 3 is in contact with the top surface of the accumulation layer 2. A first main region (an emitter region) 4 of n$^+$-type is deposited on the top surface side of the base region 3. The bottom surface of the emitter region 4 is in contact with the top surface of the base region 3. The emitter region 4 has a higher impurity concentration than the drift layer 1 and the accumulation layer 2.

The n-type accumulation layer 2 is deposited on the top surface side of the drift layer 1 and having a higher impurity concentration than the drift layer 1 in the diode part 102. The diode part 102 is not necessarily provided with the accumulation layer 2. The bottom surface of the accumulation layer 2 is in contact with the top surface of the drift layer 1. An anode region 13 of p$^-$-type is deposited on the top surface side of the accumulation layer 2. The bottom surface of the anode region 13 is in contact with the top surface of the accumulation layer 2. The anode region 13 has the top surface that is the same level as the top surface of the semiconductor substrate 10. The anode region 13 may be deposited to have the same depth and the same impurity concentration as the base region 3 in the transistor part 101.

A plurality of trenches 11 are provided separately from each other extending from the top surface of the semiconductor substrate 10 in the depth direction in each of the transistor part 101 and the diode part 102. The respective trenches 11 in the transistor part 101 penetrate the emitter region 4, the base region 3, and the accumulation layer 2 to reach the drift layer 1. The respective side surfaces of the emitter region 4, the base region 3, and the accumulation layer 2 are in contact with the side surfaces of the respective trenches 11. The respective trenches 11 in the diode part 102 penetrate the anode region 13 and the accumulation layer 2 to reach the drift layer 1. The respective side surfaces of the anode region 13 and the accumulation layer 2 are in contact with the side surfaces of the respective trenches 11.

The region between the respective trenches 11 adjacent to each other is provided with a mesa part implemented by the upper part of the semiconductor substrate 10. The mesa part is a region of the semiconductor substrate 10 interposed between the respective trenches 11 adjacent to each other, and is located at a higher position than the deepest position of the trenches 11. The upper part of the drift layer 1, the accumulation layer 2, the base region 3, and the emitter region 4 are provided in the mesa part in the transistor part 101. The upper part of the drift layer 1, the accumulation layer 2, and the anode region 13 are provided in the mesa part in the diode part 102.

A gate insulating film 6 is provided to cover the bottom surfaces and the side surfaces of the respective trenches 11. The gate insulating film 6 to be used can be a single film of a silicon dioxide film (a $SiO_2$ film), a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, or a bismuth oxide ($Bi_2O_3$) film, or a composite film including some of the above single films stacked on one another.

A gate electrode 7 is buried inside the respective trenches 11 via the gate insulating film 6. The gate insulating film 6 and the gate electrode 7 implement an insulated gate electrode structure (6, 7). The material used for the gate electrode 7 may be a polysilicon film (a doped polysilicon film) with which impurity ions such as phosphorus (P) or boron (B) are heavily doped, for example.

A part of the plural insulated gate electrode structures (6, 7) in the transistor part 101 may be a gate trench connected to a gate runner, and the other may be a dummy trench not connected to the gate runner. The plural insulated gate electrode structures (6, 7) in the diode part 102 may each be a dummy trench not connected to the gate runner.

As illustrated in FIG. 1, the plural trenches 11 each have a straight (stripe-shaped) part extending parallel to each other in one direction (the upper-lower direction in FIG. 1) in the planar pattern. A contact region 5 of $p^+$-type and the emitter region 4 of $n^+$-type are alternately and repeatedly arranged parallel to the extending direction (the longitudinal direction) of the respective trenches 11 in the transistor part 101. The contact region 5 is in contact with the emitter region 4. The contact region 5 is deposited on the top surface side of the base region 3 illustrated in FIG. 2. The bottom surface of the contact region 5 is in contact with the top surface of the base region 3. The contact region 5 has a higher impurity concentration than the base region 3. The anode region 13 in the diode part 102 has a straight (stripe-shaped) part extending parallel to the extending direction of the respective trenches 11.

As illustrated in FIG. 2, an interlayer insulating film 20 is deposited on the top surfaces of the semiconductor substrate 10 and the respective insulated gate electrode structures (6, 7). The interlayer insulating film 20 is a single film of a silicon oxide film (a $SiO_2$ film) without containing phosphorus (P) or boron (B) which is referred to as a non-doped silicate glass (NSG) film, a phosphosilicate glass (PSG) film, a borosilicate glass (BSG) film, a borophosphosilicate glass (BPSG) film, or a silicon nitride ($Si_3N_4$) film, or a stacked layer of the above films stacked on one another.

The interlayer insulating film 20 located on the mesa part of the semiconductor substrate 10 is provided with contact holes 20a penetrating the interlayer insulating film 20. A connection conductor (a contact plug) 30 is buried in the respective contact holes 20a. The bottom surface of the respective connection conductors 30 is in contact with the respective top surfaces of the emitter region 4 and the contact region 5 in the transistor part 101. The bottom surface of the respective connection conductors 30 is in contact with the top surface of the anode region 13 in the diode part 102.

A front-surface electrode 40 is deposited on the interlayer insulating film 20. The front-surface electrode 40 in the transistor part 101 is electrically connected to the emitter region 4 and the contact region 5 via the respective connection conductors 30 so as to serve as an emitter electrode. The front-surface electrode 40 in the diode part 102 is electrically connected to the anode region 13 via the respective connection conductors 30 so as to serve as an anode electrode.

FIG. 1 omits the illustration of the interlayer insulating film 20, the connection conductors 30, and the front-surface electrode 40 illustrated in FIG. 2. FIG. 1 schematically indicates the positions of the contact holes 20a of the interlayer insulating film 20 illustrated in FIG. 2 by the broken lines. The contact holes 20a each have a straight (stripe-shaped) part extending parallel to the longitudinal direction of the respective trenches 11 in the planar pattern.

The respective contact holes 20a in the transistor part 101 are provided on the top surface side of the emitter region 4 and the contact region 5. The respective contact holes 20a in the diode part 102 are provided on the top surface side of the anode region 13.

Figure 3:
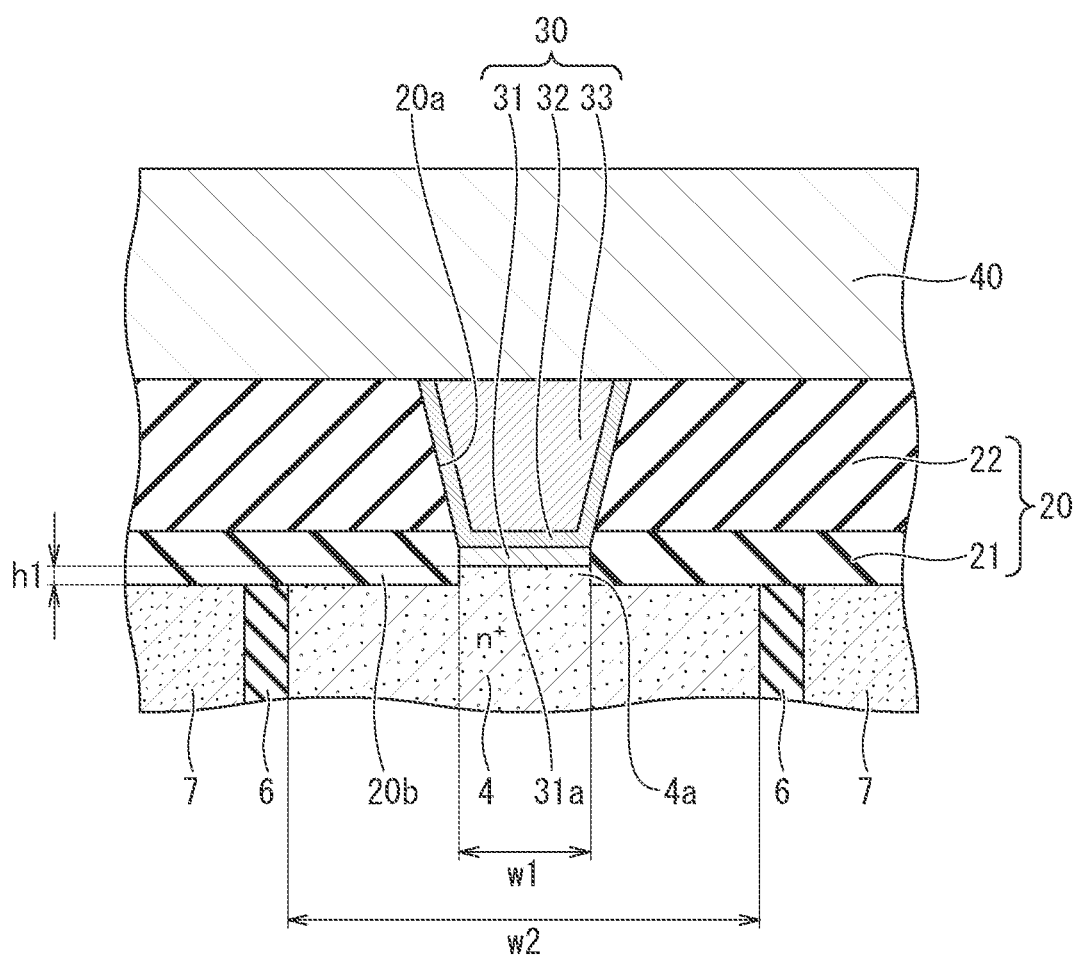
FIG. 3 is an enlarged view of region A in FIG. 2.

FIG. 3 illustrates the cross section enlarging the region A including the connection conductor 30 in the transistor part 101 illustrated in FIG. 2. The cross section enlarging the region including the connection conductor 30 in the diode part 102 illustrated in FIG. 2 has the same structure as the cross section illustrated in FIG. 3.

As illustrated in FIG. 3, a projection 4a is provided at the upper part of the emitter region 4. The projection 4a is located separately from the trenches 11 substantially at the middle position of the mesa part interposed between the trenches 11 adjacent to each other. The projection 4a has a height h1 set in a range of about 20 nanometers or greater and 300 nanometers or less, for example. The projection 4a has a width w1 set in a range of about 20% or greater and 90% or less of a width w2 of the mesa part, for example.

The similar projection is also provided at the upper part of the contact region 5 illustrated in FIG. 1. The projection has a straight (stripe-shaped) part extending parallel to the longitudinal direction of the respective trenches 11 in the planar pattern substantially at the middle position of the mesa part interposed between the trenches 11 adjacent to each other.

As illustrated in FIG. 3, the interlayer insulating film 20 includes a first insulating film 21 deposited on the top surface side of the insulated gate electrode structure (6, 7) and the emitter region 4, and a second insulating film 22 deposited on the top surface side of the first insulating film 21. The first insulating film 21 is a high temperature oxide (HTO) film, and the second insulating film 22 is a BPSG film, for example. The second insulating film 22 has a greater thickness than the first insulating film 21. While FIG. 3 illustrates the case in which the interlayer insulating film 20 has the double-layer structure, the interlayer insulating film may have a single-layer structure or may have a multi-layer structure including three or more layers stacked on one another.

The contact hole 20a of the interlayer insulating film 20 has a tapered shape with a width gradually decreased from the upper side to the lower side, for example. The top surface of the projection 4a is exposed on the bottom surface of the contact hole 20a. The width of the bottom surface of the contact hole 20a substantially conforms to the width w1 of the projection 4a. The side surface of the projection 4a is in contact with the side surface of the first insulating film 21. The top surface of the projection 4a is located at a higher position than the bottom surface 20b of the interlayer insulating film 20 that is the bottom surface of the first insulating film 21.

The connection conductor 30 is buried in the contact hole 20a. The connection conductor 30 includes a titanium silicide layer 31 that is a silicide layer including titanium silicide ($TiSi_2$), a titanium nitride film 32 that is a barrier metal film including titanium nitride (TiN), and a tungsten film 33 that is a metal film including tungsten (W).

The titanium silicide layer 31 has a thickness set in a range of about 20 nanometers or greater and 80 nanometers or less, for example. The titanium nitride film 32 has a thickness set in a range of about 20 nanometers or greater and 140 nanometers or less, for example. The tungsten film 33 has a thickness set in a range of about 100 nanometers or greater and 1500 nanometers or less, for example.

The titanium silicide layer 31 is deposited at the bottom of the contact hole 20a. The bottom surface 31a of the titanium silicide layer 31 is in contact with the top surface of the projection 4a. The side surface of the titanium silicide layer 31 is in contact with the first insulating film 21. FIG. 3 illustrates the case in which the bottom surface 31a of the titanium silicide layer 31 is flat, and the entire bottom surface 31a of the titanium silicide layer 31 is located at a higher position than the bottom surface 20b of the interlayer insulating film 20.

At least the edge part of the bottom surface 31a the titanium silicide layer 31 in contact with the first insulating film 21 is only required to be located at the higher position than the bottom surface 20b of the interlayer insulating film 20. For example, the titanium silicide layer 31 may have a structure in which the bottom surface 31a has a convex shape projecting downward so that the middle part of the bottom surface 31a is located at a lower position than the edge part and is located at a lower position than the bottom surface 20b of the interlayer insulating film 20.

The titanium nitride film 32 is provided to cover the top surface of the titanium silicide layer 31 and the side surface of the contact hole 20a. The bottom surface of the titanium nitride film 32 located at the bottom of the contact hole 20a is in contact with the top surface of the titanium silicide layer 31. The titanium nitride film 32 located on the side surface of the contact hole 20a is in contact with the respective side surfaces of the first insulating film 21 and the second insulating film 22.

The tungsten film 33 is deposited in the contact hole 20a via the titanium nitride film 32 and the titanium silicide layer 31 so as to fill the contact hole 20a. The titanium nitride film 32 and the tungsten film 33 may be not only provided in the contact hole 20a but further extend along the top surface of the second insulating film 22.

The front-surface electrode 40 is deposited on the respective top surfaces of the titanium nitride film 32, the tungsten film 33, and the second insulating film 22. The front-surface electrode 40 is electrically connected to the emitter region 4 via the connection conductor 30. The front-surface electrode 40 can be formed of metal such as aluminum (Al), an aluminum alloy, and copper (Cu). Examples of the aluminum alloy include Al-silicon (Si), Al-copper (Cu)—Si, and Al—Cu.

As illustrated in FIG. 2, a life-time control region 60 is provided inside the drift layer 1. The life-time control region 60 is provided uniformly across the entire area of the transistor part 101 and the diode part 102. The life-time control region 60 may be only provided selectively in the diode part 102 without being provided in the transistor part 101. Alternatively, the life-time control region 60 may be provided selectively in a part of the transistor part 101.

The life-time control region 60 is composed of crystal defects (point defects) of helium (He) or protons (hydrogen) implanted as a life-time killer. The presence of the life-time control region 60 can improve and enhance the properties of the semiconductor device.

A buffer layer 8 of n-type having a higher impurity concentration than the drift layer 1 is deposited on the bottom surface side of the drift layer 1 in the transistor part 101 and the diode part 102. The top surface of the buffer layer 8 is in contact with the bottom surface of the drift layer 1. The buffer layer 8 functions as a field-stop layer that prevents a depletion layer that spreads from the bottom surface side of the base region 3 and the anode region 13 from reaching a second main region (a collector region) 9 and a cathode region 12 described below.

The collector region 9 of $p^+$-type is deposited on the bottom surface side of the buffer layer 8 in the transistor part 101. The top surface of the collector region 9 is in contact with the bottom surface of the buffer layer 8. The collector region 9 has a higher impurity concentration than the base region 3. The cathode region 12 of $n^+$-type having a higher impurity concentration than the buffer layer 8 is deposited on the bottom surface side of the buffer layer 8 in the diode part 102. The top surface of the cathode region 12 is in contact with the bottom surface of the buffer layer 8. The cathode region 12 is deposited at the same level as the buffer layer 8. The side surface of the cathode region 12 is in contact with the side surface of the collector region 9.

A rear-surface electrode 50 is deposited on the bottom surface side of the collector region 9 and the cathode region 12. The rear-surface electrode 50 can be a single film of gold (Au), or a metal film including titanium (Ti), nickel (Ni), and gold (Au) stacked in this order, for example. The rear-surface electrode 50 functions as a collector electrode in the transistor part 101, and functions as a cathode electrode in the diode part 102.

In the transistor part 101, when a positive voltage is applied to the rear-surface electrode 50 while the front-surface electrode 40 is used as a ground potential, and a positive voltage of a threshold or greater is applied to the gate electrode 7, an inversion layer (a channel) is formed in the base region 3 toward the side surface of the respective trenches 11, and the transistor part 101 is thus turned ON. In the ON-state, a current flows from the rear-surface electrode 50 to the front-surface electrode 40 through the collector region 9, the buffer layer 8, the drift layer 1, the accumulation layer 2, the inversion layer of the base region 3, and the emitter region 4. When the voltage applied to the gate electrode 7 is less than the threshold, no inversion layer is provided in the base region 3, and the transistor part 101 is thus in the OFF-state, which does not cause the current to flow from the rear-surface electrode 50 toward the front-surface electrode 40. The diode part 102 then leads a free-wheeling current to flow to cause an electrical conduction in the reverse direction when the transistor part 101 is turned OFF.

<Method of Manufacturing Semiconductor Device>

An example of a method of manufacturing the semiconductor device according to the first embodiment is described below with reference to FIG. 1 to FIG. 12. FIG. 6 to FIG. 11 are the cross-sectional views corresponding to FIG. 3. It should be understood that the method of manufacturing the semiconductor device described below is an example, and the semiconductor device can be manufactured by any other methods including modified examples of this embodiment within the scope of the appended claims.

First, the $n^-$-type semiconductor substrate 10 implementing the $n^-$-type drift layer 1 illustrated in FIG. 2 is prepared. Next, a photolithography step and an ion implantation step are repeatedly executed so as to activate impurity ions implanted to the semiconductor substrate 10 by annealing. These steps provide the n-type accumulation layer 2, the $p^-$-type base region 3, the $n^+$-type emitter region 4, and the $p^+$-type contact region 5 (refer to FIG. 1) at the upper part of the semiconductor substrate 10 in the transistor part 101, as illustrated in FIG. 1 and FIG. 2. Similarly, the n-type accumulation layer 2 and the $p^-$-type anode region 13 are formed at the upper part of the semiconductor substrate 10 in the diode part 102.

Figure 4:
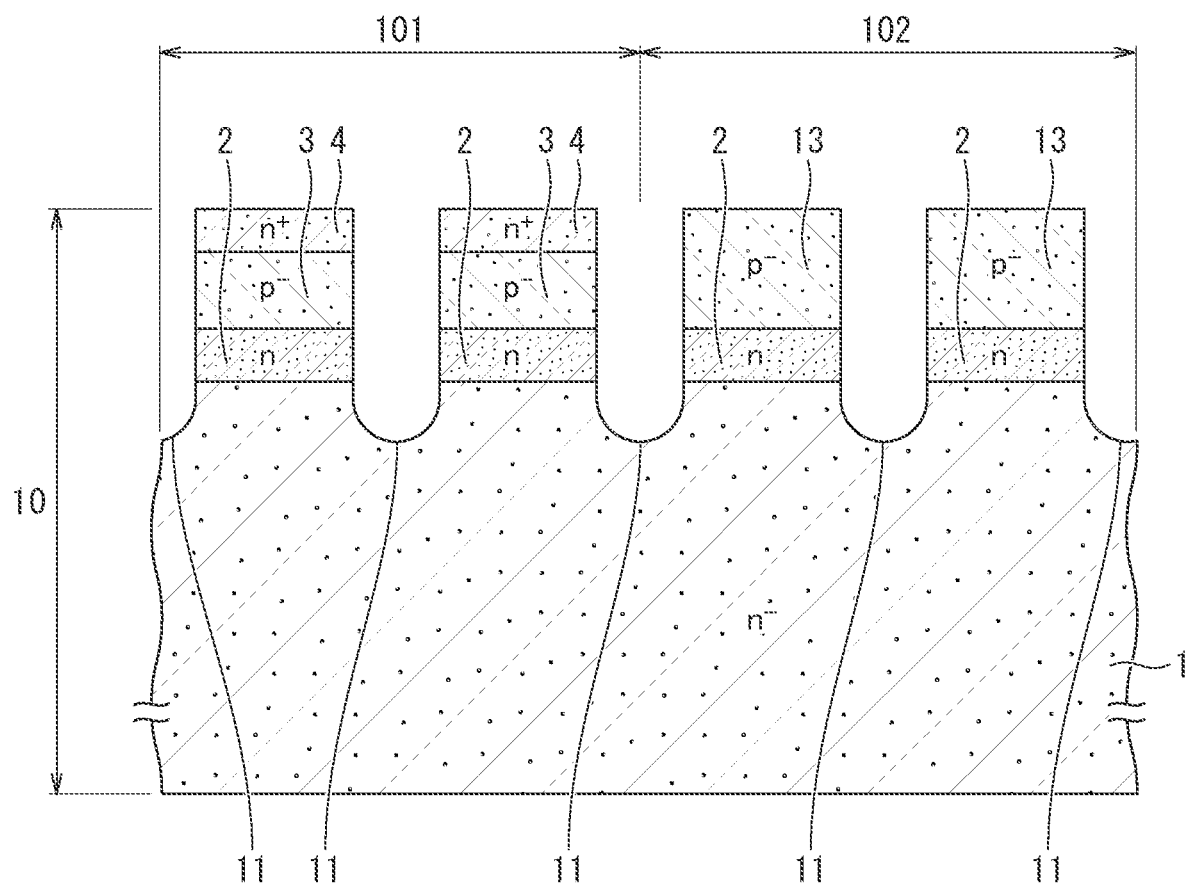
FIG. 4 is a cross-sectional view for explaining an example of a method of manufacturing the semiconductor device according to the first embodiment.

The emitter region 4, the contact region 5, the base region 3, the anode region 13, the accumulation layer 2, and the drift layer 1 are then partly and selectively removed from the top surface side of the semiconductor substrate 10 by photolithography and dry etching. The plural trenches 11 are thus formed at the upper part of the semiconductor substrate 10, as illustrated in FIG. 4.

Figure 5:
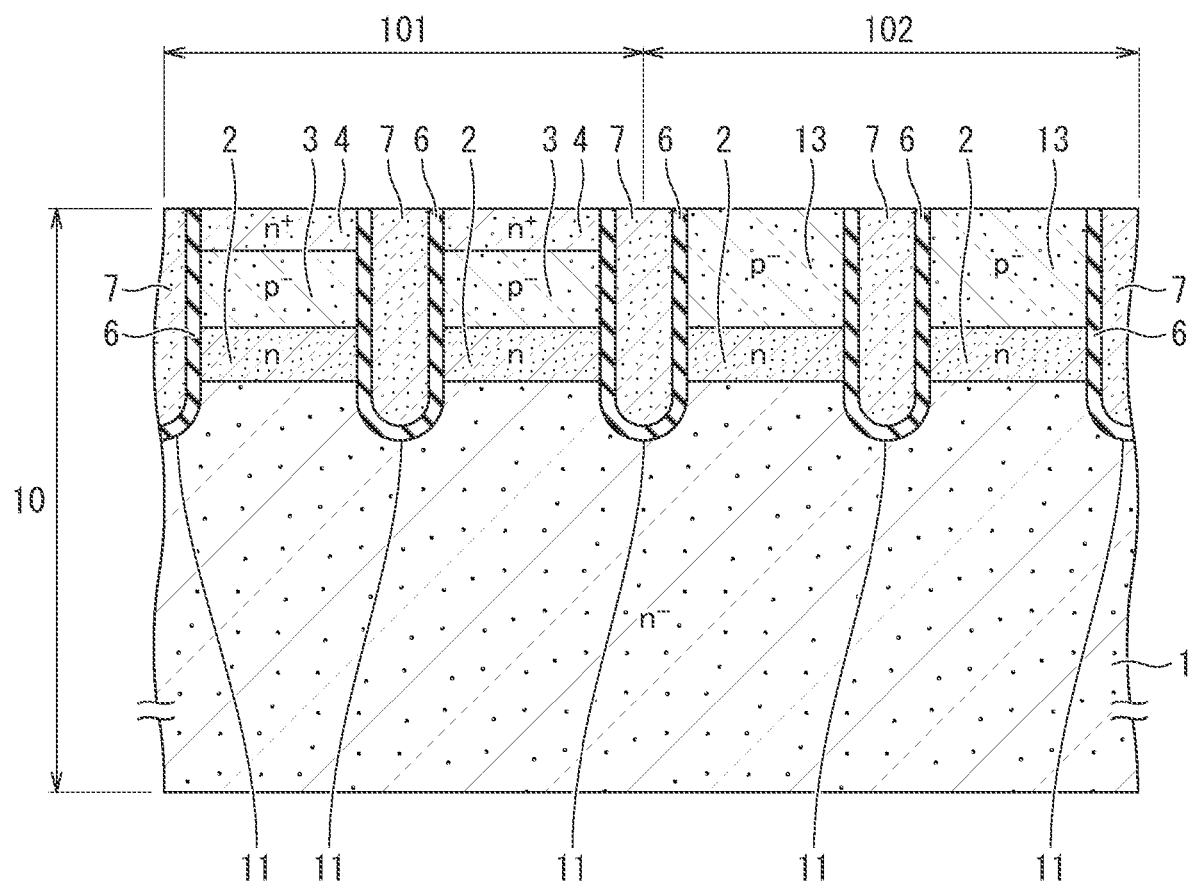
FIG. 5 is a cross-sectional view continued from FIG. 4 for explaining the example of the method of manufacturing the semiconductor device according to the first embodiment.

Next, the gate insulating film 6 is formed on the bottom surfaces and the side surfaces of the trenches 11 and the respective top surfaces of the emitter region 4, the contact region 5, and the anode region 13 by a thermal oxidation method or a chemical vapor deposition (CVD) method, for example. A polysilicon film (a doped polysilicon film) with which impurity ions such as phosphorus (P) or boron (B) are heavily doped is deposited so as to fill the inside of the respective trenches 11 via the gate insulating film 6 by the CVD method and the like. The polysilicon film and the gate insulating film 6 on the semiconductor substrate 10 are then selectively removed by photolithography and dry etching. The insulated gate electrode structure (6, 7) composed of the gate insulating film 6 and the gate electrode 7 of the polysilicon film is thus formed in the respective trenches 11, as illustrated in FIG. 5.

Figure 6:
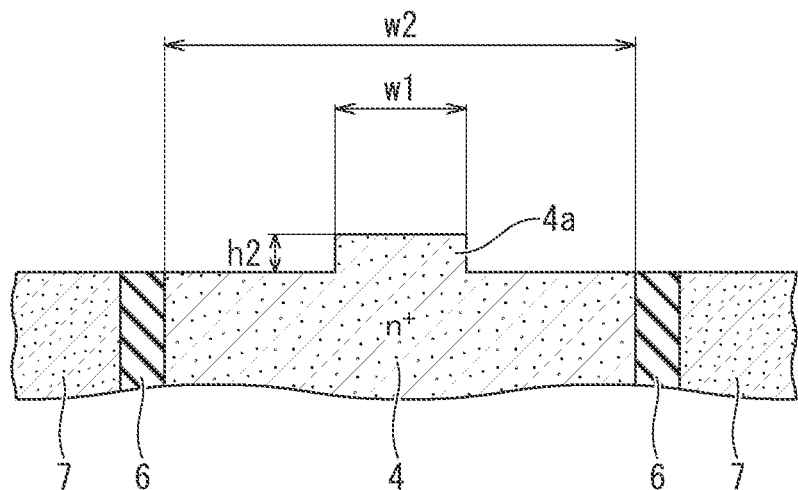
FIG. 6 is a cross-sectional view continued from FIG. 5 for explaining the example of the method of manufacturing the semiconductor device according to the first embodiment.

Next, a photoresist film is applied on the respective top surfaces of the insulated gate electrode structures (6, 7), the emitter region 4, the contact region 5, and the anode region 13, and is then delineated by photolithography. Using the delineated photoresist film as a mask for etching, the emitter region 4 and the respective insulated gate electrode structures (6, 7) are partly and selectively removed by dry etching. These steps provide the projection 4a at the upper part of the emitter region 4, as illustrated in FIG. 6. The similar projection is also formed at the upper part of the contact region 5 in the transistor part 101 and at the upper part of the anode region 13 in the diode part 102 illustrated in FIG. 1. The height h2 of the projection 4a is greater than the height h1 of the projection 4a illustrated in FIG. 3.

Figure 7:
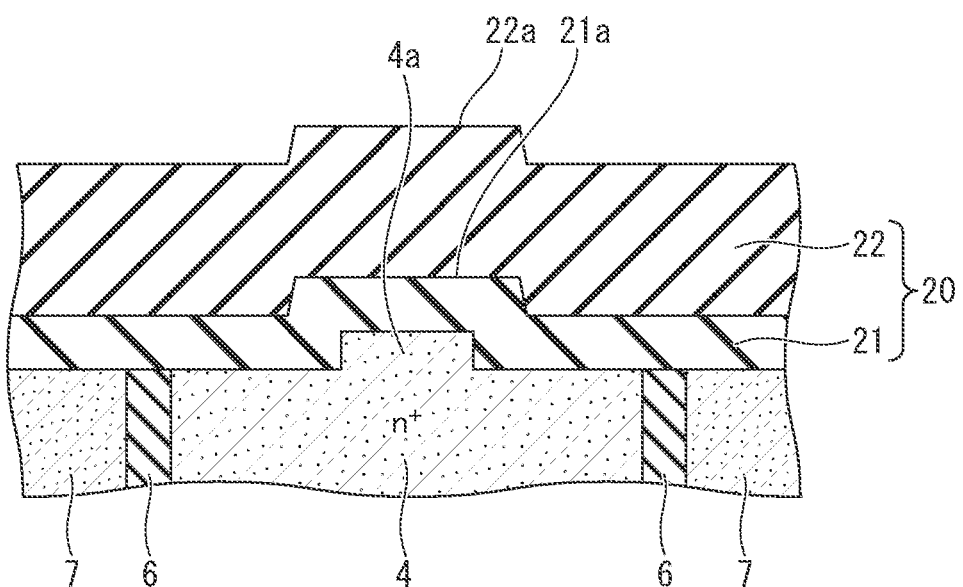
FIG. 7 is a cross-sectional view continued from FIG. 6 for explaining the example of the method of manufacturing the semiconductor device according to the first embodiment.

Next, the first insulating film 21 that is a HTO film and the second insulating film 22 that is a BPSG film are sequentially formed by the CVD method and the like on the respective top surfaces of the insulated gate electrode structures (6, 7), the emitter region 4, the contact region 5, and the anode region 13. The interlayer insulating film 20 including the first insulating film 21 and the second insulating film 22 is thus formed, as illustrated in FIG. 7. The first insulating film 21 and the second insulating film 22 respectively have a step 21a and a step 22a each corresponding to the projection 4a. The top surface of the second insulating film 22 may be flattened by a reflow after the deposition of the second insulating film 22. The top surface of the projection 4a is located at a higher position than the bottom surface of the interlayer insulating film 20.

Figure 8:
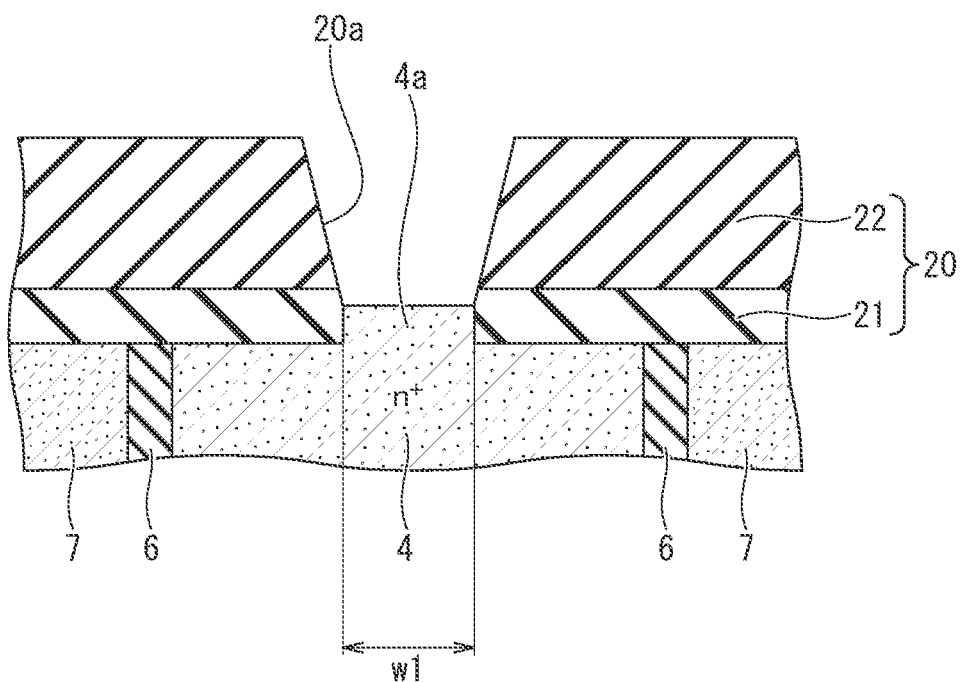
FIG. 8 is a cross-sectional view continued from FIG. 7 for explaining the example of the method of manufacturing the semiconductor device according to the first embodiment.

Next, a photoresist film is applied on the top surface of the interlayer insulating film 20, and is then delineated by photolithography. Using the delineated photoresist film as a mask for etching, the interlayer insulating film 20 is partly and selectively removed by dry etching, so as to open the contact hole 20a to which the top surface of the projection 4a is exposed, as illustrated in FIG. 8. The width of the contact hole 20a substantially conforms to the width w1 of the top surface of the projection 4a. The top surface of the projection 4a is entirely exposed, while the top surface of the flat part of the emitter region 4 other than the projection 4a in the mesa part is not exposed but is covered with the interlayer insulating film 20.

After the contact hole 20a is opened, p-type impurity ions such as boron (B) or boron fluoride ($BF_2$) may be selectively implanted to the projection of the contact region 5 illustrated in FIG. 1 and then subjected to annealing to activate the p-type impurity ions, so as to facilitate the extraction of the hole.

Figure 9:
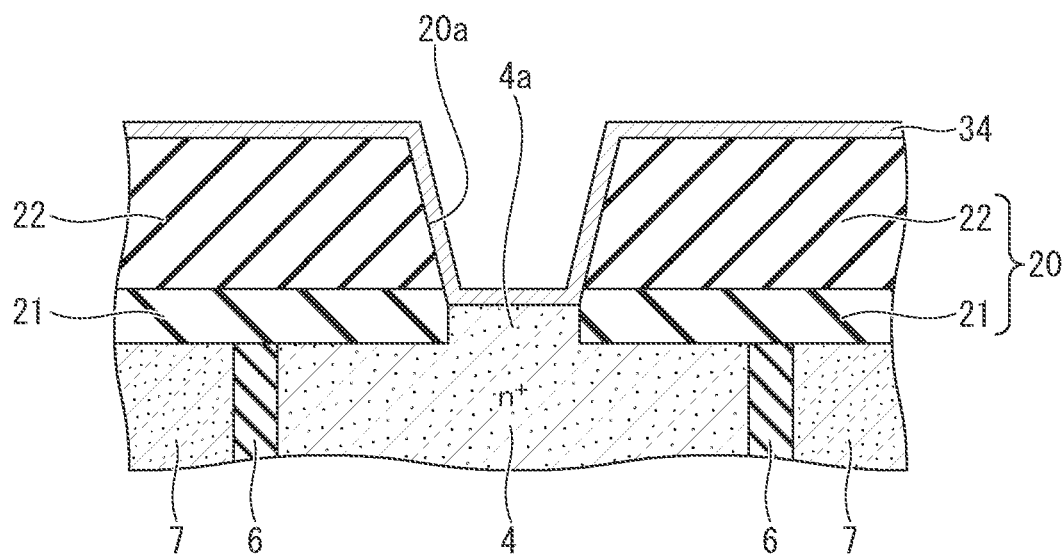
FIG. 9 is a cross-sectional view continued from FIG. 8 for explaining the example of the method of manufacturing the semiconductor device according to the first embodiment.

Next, a native oxide film at the bottom of the contact hole 20a is removed by use of hydrofluoric acid (HF) or the like. A titanium film 34 is then deposited on the top surface of the projection 4a, the side surface of the contact hole 20a, and the top surface of the second insulating film 22 by sputtering or vapor deposition, for example, as illustrated in FIG. 9. The titanium film 34 has a thickness set in a range of about 20 nanometers or greater and 80 nanometers or less, for example.

Figure 10:
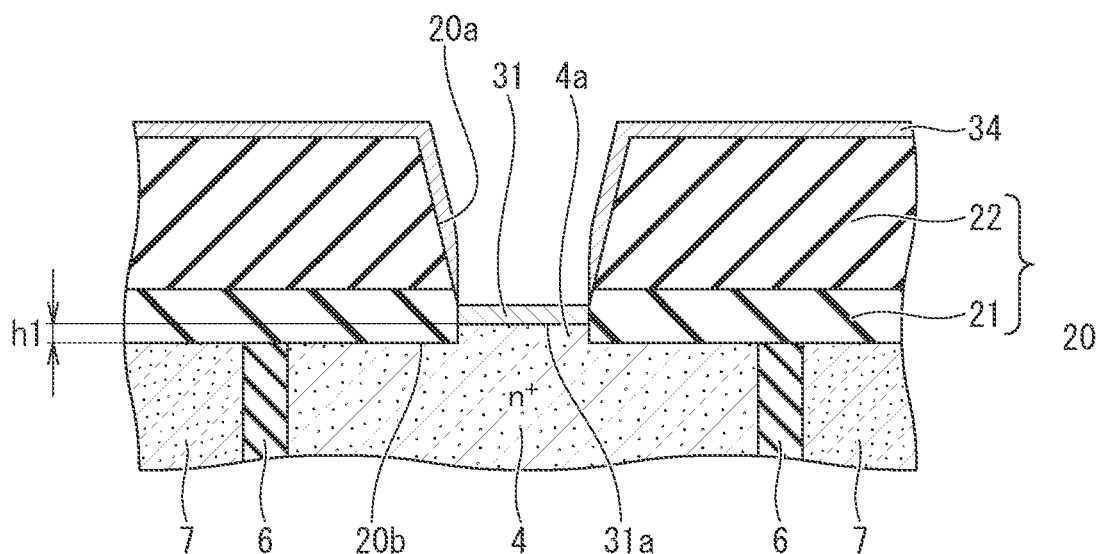
FIG. 10 is a cross-sectional view continued from FIG. 9 for explaining the example of the method of manufacturing the semiconductor device according to the first embodiment.

Next, titanium (Ti) of the titanium film 34 located at the bottom of the contact hole 20a and silicon (Si) of the projection 4a are led to react with each other by heat treatment such as rapid thermal annealing (RTA) so as to form the titanium silicide layer 31 at the bottom of the contact hole 20a, as illustrated in FIG. 10. The volume of the projection 4a is decreased and the height h1 of the projection 4a is thus decreased upon the formation of the titanium silicide layer 31. However, since a part of the projection 4a remains, and the top surface of the projection 4a and the bottom surface 31a of the titanium silicide layer 31 are each located at a higher position than the bottom surface 20b of the interlayer insulating film 20, eaves (overhangs) can be prevented from being formed at the edge part of the first insulating film 21.

While FIG. 10 illustrates the case in which the titanium film 34 located at the bottom of the contact hole 20a is all silicided, an unreacted part of the titanium film 34 located at the bottom of the contact hole 20a may remain on the top surface side of the titanium silicide layer 31.

Next, the titanium film 34 located on the top surface of the second insulating film 22 and the side surface of the contact hole 20a is removed by wet etching and the like. The unreacted titanium film 34, when remains at the bottom of the contact hole 20a, is also removed. These steps thus remove all of the titanium film 34.

Figure 11:
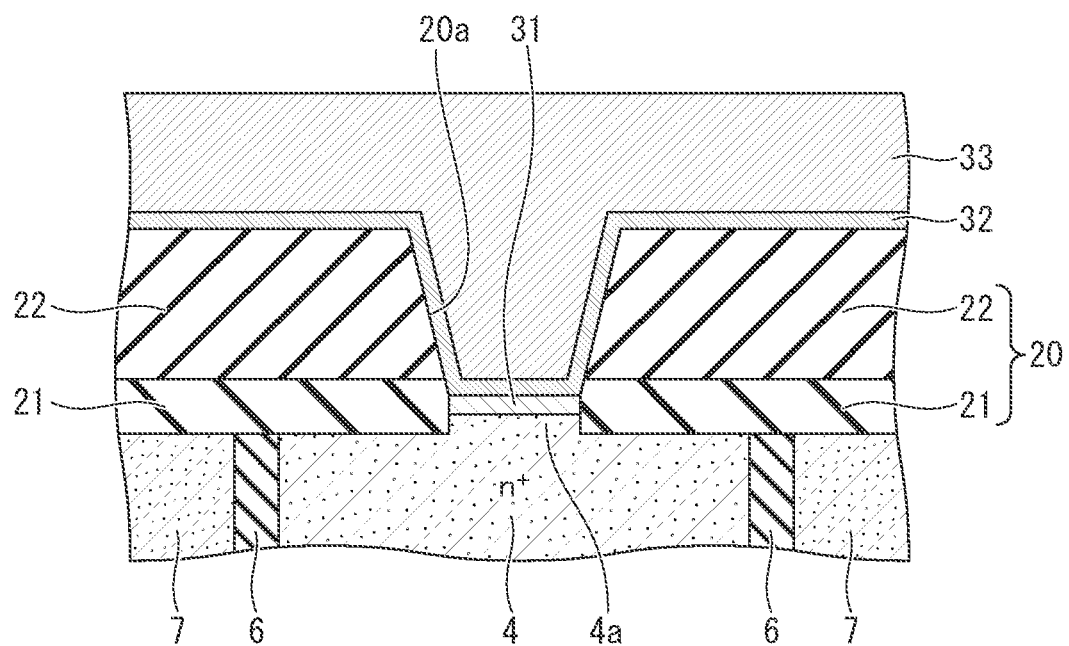
FIG. 11 is a cross-sectional view continued from FIG. 10 for explaining the example of the method of manufacturing the semiconductor device according to the first embodiment.

Next, the titanium nitride film 32 is formed on the top surface of the titanium silicide layer 31, the side surface of the contact hole 20a, and the top surface of the second insulating film 22 by sputtering or vapor deposition, for example. The tungsten film 33 is further formed to fill the contact hole 20a via the titanium nitride film 32 by the CVD method and the like, as illustrated in FIG. 11. The titanium nitride film 32 and the tungsten film 33 located on the top surface of the second insulating film 22 are then selectively removed by dry etching, for example. These steps provide the connection conductor 30 including the titanium silicide layer 31, the titanium nitride film 32, and the tungsten film 33. The titanium nitride film 32 and the tungsten film 33 located on the top surface of the second insulating film 22 may be allowed to remain without being removed.

Next, the front-surface electrode 40 is deposited on the respective top surfaces of the connection conductor 30 and the second insulating film 22 by sputtering or vapor deposition, for example, as illustrated in FIG. 3. Next, the semiconductor substrate 10 is ground from the bottom surface side by chemical mechanical polishing (CMP), for example, so that the thickness of the semiconductor substrate 10 is adjusted to conform to that of a final product.

Next, n-type impurity ions are implanted sequentially to different depths across the entire bottom surface of the semiconductor substrate 10. The impurity ions are then activated by annealing so as to form the n-type buffer layer 8 and the $n^+$-type cathode region 12 at the lower part of the semiconductor substrate 10. Next, a mask for ion implantation is formed by photolithography, and p-type impurity ions are implanted to the transistor part 101. The impurity ions are then activated by annealing to invert the conductivity type of the cathode region 12 in the transistor part 101 so as to form the p+-type collector region 9.

Figure 12:
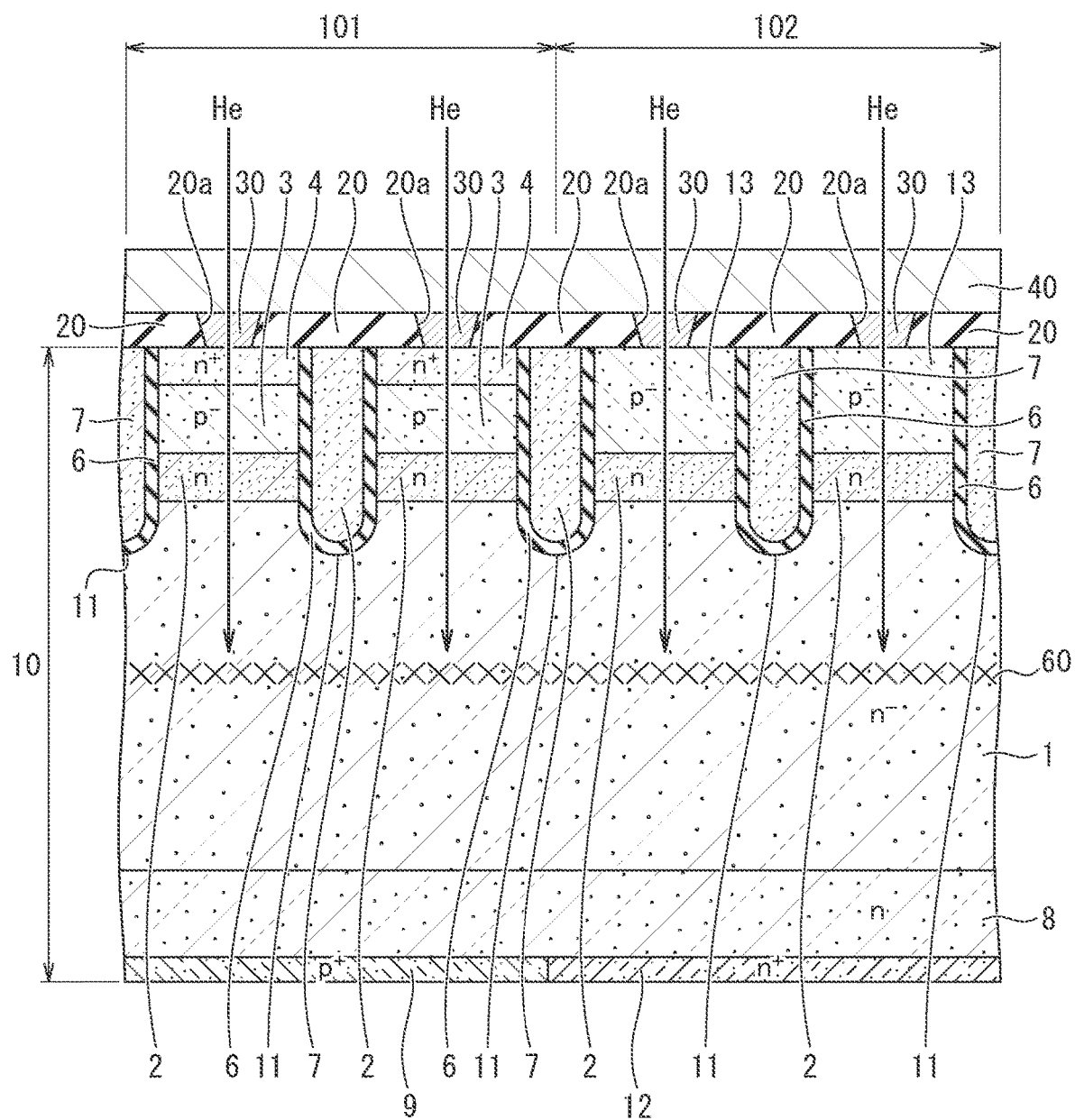
FIG. 12 is a cross-sectional view continued from FIG. 11 for explaining the example of the method of manufacturing the semiconductor device according to the first embodiment.

Next, as illustrated in FIG. 12, a particle beam of helium (He), for example, is radiated from the top surface side of the semiconductor substrate 10 so as to uniformly form the life-time control region 60 inside the drift layer 1. Instead of the use of the particle beam of helium (He), a particle beam of proton (P) or an electron beam may be radiated. The particle beam may be radiated not from the top surface side but from the bottom surface side. Alternatively, a photoresist film may be delineated by photolithography to be used as a shielding film so that the life-time control region 60 is locally formed.

Next, heat treatment (annealing) is executed. The annealing may be executed under an atmosphere containing hydrogen. The annealing regulates the formation of crystal defects of the life-time control region 60 so as to ensure an intended life time. While the radiation of the particle beam illustrated in FIG. 12 leads the gate insulating film 6 to be damaged to cause a dangling bond at the interface between the semiconductor substrate 10 and the gate insulating film 6 to lead to a decrease in a gate threshold, the hydrogen contained in the atmosphere or in the semiconductor substrate 10 reaches the gate insulating film 6 during the annealing to terminate the dangling bond, so as to avoid a decrease in the gate threshold. At this point, the hydrogen during the annealing can sufficiently reach the gate insulating film 6 without being absorbed to the titanium film 34, since the titanium film 34 not reacted has been removed after the formation of the titanium silicide layer 31.

The hydrogen can also sufficiently reach the gate insulating film 6 without being absorbed to the titanium film 34 in the other steps of using the hydrogen other than the annealing after the radiation of the particle beam such as the step of forming the tungsten film 33. In addition, a decrease in the gate threshold caused by the damage to the gate insulating film 6 during the formation of the contact hole 20*a*, for example, can be avoided also in a heating step other than the annealing after the radiation of the particle beam.

Thereafter, the rear-surface electrode 50 including gold (Au) is formed on the entire bottom surface of the semiconductor substrate 10 by sputtering or vapor deposition, for example. The semiconductor device according to the first embodiment is thus completed by the method as described above.

Comparative Example

A method of manufacturing a semiconductor device of a comparative example is described below with reference to FIG. 13 to FIG. 17. The method of manufacturing the semiconductor device of the comparative example includes the same procedure as the method of manufacturing the semiconductor device according to the first embodiment by the step of forming the insulated gate electrode structures (6, 7) illustrated in FIG. 5.

Figure 13:
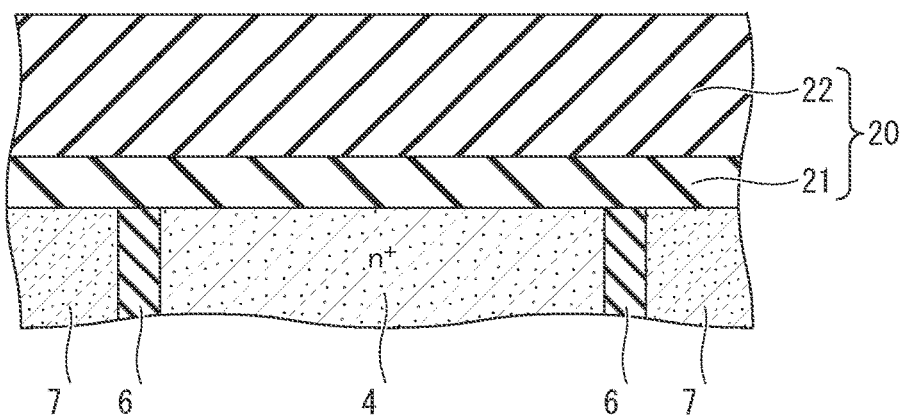
FIG. 13 is a cross-sectional view for explaining a method of manufacturing a semiconductor device of a comparative example.

Next, the first insulating film 21 and the second insulating film 22 are sequentially deposited to form the interlayer insulating film 20 on the respective top surfaces of the insulated gate electrode structures (6, 7) and the emitter region 4 by the CVD method, for example, without the projection formed in the mesa part interposed between the trenches 11 adjacent to each other, as illustrated in FIG. 13.

Figure 14:
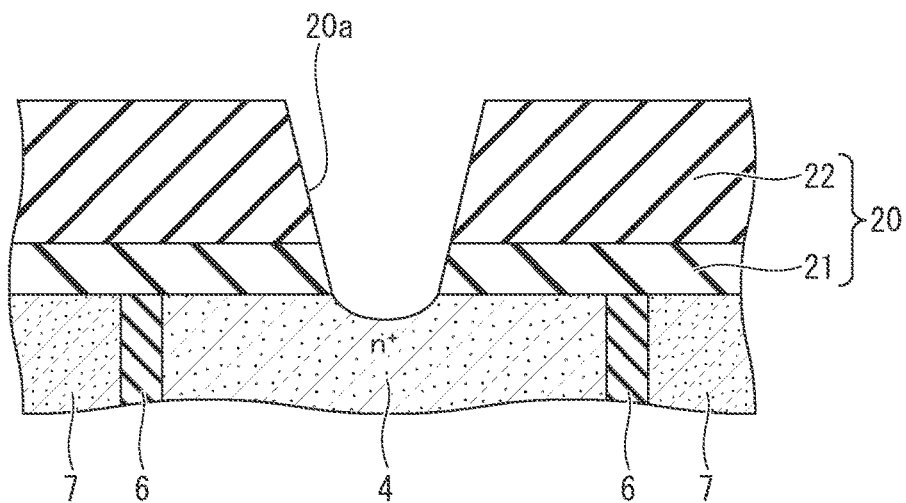
FIG. 14 is a cross-sectional view continued from FIG. 13 for explaining the method of manufacturing the semiconductor device of the comparative example.

Next, as illustrated in FIG. 14, the contact hole 20*a* is opened in the interlayer insulating film 20 by photolithography and dry etching so as to expose a part of the emitter region 4 to the contact hole 20*a*. While FIG. 14 illustrates the case in which the bottom surface of the contact hole 20*a* hollows out the upper part of the emitter region 4, the etching may be stopped immediately at the point of exposing the top surface of the emitter region 4.

Figure 15:
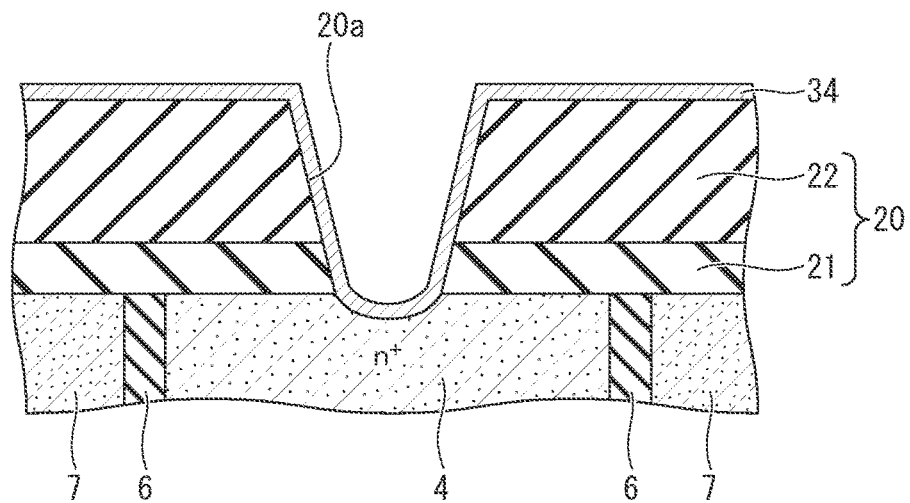
FIG. 15 is a cross-sectional view continued from FIG. 14 for explaining the method of manufacturing the semiconductor device of the comparative example.
Figure 16:
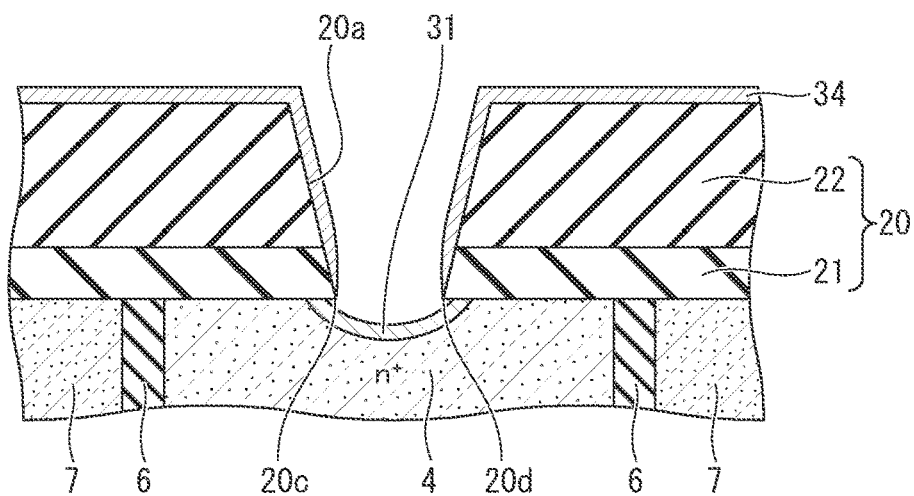
FIG. 16 is a cross-sectional view continued from FIG. 15 for explaining the method of manufacturing the semiconductor device of the comparative example.

Next, as illustrated in FIG. 15, the titanium film 34 is deposited on the bottom surface and the side surface of the contact hole 20*a* and the top surface of the second insulating film 22 by the CVD method, for example. The titanium film 34 located at the bottom of the contact hole 20*a* is then subjected to silicidation so as to form the titanium silicide layer 31, as illustrated in FIG. 16. At this point, the volume of the emitter region 4 is decreased and the lower part of the first insulating film 21 is hollowed out, causing eaves (overhangs) 20*c* and 20*d* at the edge part of the first insulating film 21.

Figure 17:
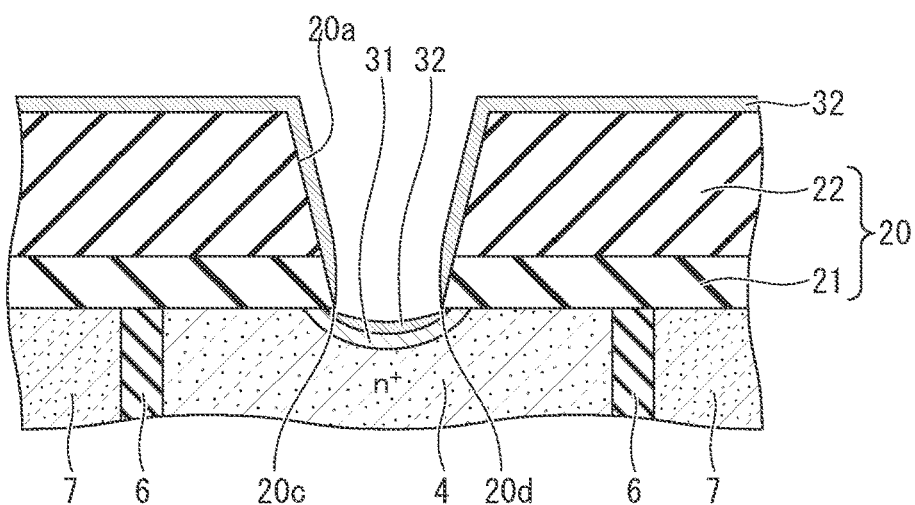
FIG. 17 is a c cross-sectional view continued from FIG. 16 for explaining the method of manufacturing the semiconductor device of the comparative example.

Next, as illustrated in FIG. 17, the titanium nitride film 32 is deposited on the top surface of the titanium silicide layer 31, the side surface of the contact hole 20*a*, and the top surface of the second insulating film 22 by the CVD method, for example. However, the presence of the eaves 20*c* and 20*d* at the first insulating film 21 causes voids in the titanium nitride film 32 at the positions provided with the eaves 20*c* and 20*d*, which impedes the formation of the intended titanium nitride film 32.

The subsequent formation of the tungsten film cannot be made appropriately at the positions of the voids in the titanium nitride film 32 if the tungsten film is deposited to fill the contact hole 20*a* via the titanium nitride film 32 by the CVD method, for example. The inappropriate formation of the tungsten film may cause tungsten (W) of the tungsten film to spread toward silicon (Si) in the mesa part.

Even if the titanium film 34 is subjected to silicidation after the titanium film 34 and the titanium nitride film 32 are sequentially deposited so as to form the titanium silicide film 31, the titanium nitride film 32 may be partly dragged in association with the decrease in the volume of the emitter region 4 upon the formation of the titanium silicide layer 31, causing a void in the titanium nitride film 32 accordingly.

In contrast to the method of manufacturing the semiconductor device of the comparative example, the method of manufacturing the semiconductor device according to the first embodiment forms the projection 4*a* at the upper part of the emitter region 4 provided in the mesa part interposed between the trenches 11 adjacent to each other, as illustrated in FIG. 6. This leads the bottom surface 31*a* of the titanium silicide layer 31 to be located at the higher position than the bottom surface 20*b* of the interlayer insulating film 20 upon the formation of the titanium silicide layer 31, as illustrated in FIG. 10, so as to prevent the eaves from being caused in the first insulating film 21. The manufacturing method according to the first embodiment thus can form the titanium nitride film 32 favorably after the formation of the titanium silicide layer 31, and further form the tungsten film 33 favorably on the titanium nitride film 32, so as to avoid the spread of tungsten (W) of the tungsten film 33 toward silicon (Si) in the mesa part.

First Modified Example

Figure 18:
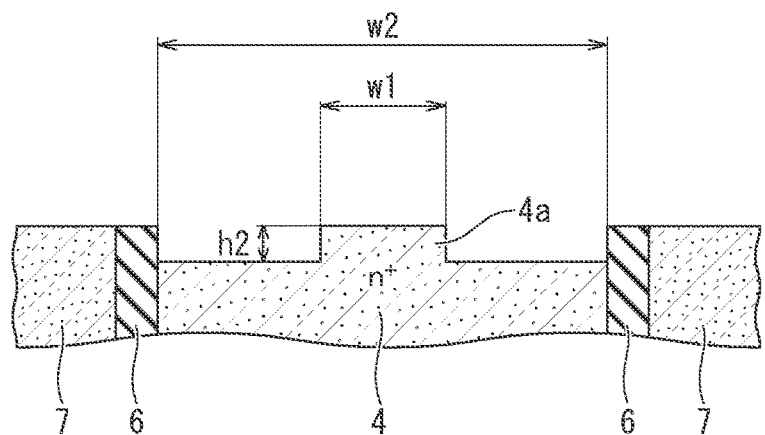
FIG. 18 is a cross-sectional view for explaining a method of manufacturing a semiconductor device according to a first modified example of the first embodiment.

A method of manufacturing a semiconductor device according to a first modified example of the first embodiment differs from the method of manufacturing the semiconductor device according to the first embodiment in selectively removing only a part of the upper part of the emitter region 4 without removing the gate insulating film 6 or the gate electrode 7 when forming the projection 4a at the upper part of the emitter region 4, as illustrated in FIG. 18. The other steps of the method of manufacturing the semiconductor device according to the first modified example of the first embodiment are the same as those of the method of manufacturing the semiconductor device according to the first embodiment.

The first modified example of the first embodiment, which selectively removes only a part of the upper part of the emitter region 4 without removing the gate insulating film 6 or the gate electrode 7 when forming the projection 4a at the upper part of the emitter region 4, can form the titanium nitride film 32 and the tungsten film 33 favorably as in the case of the first embodiment.

Second Modified Example

Figure 19:
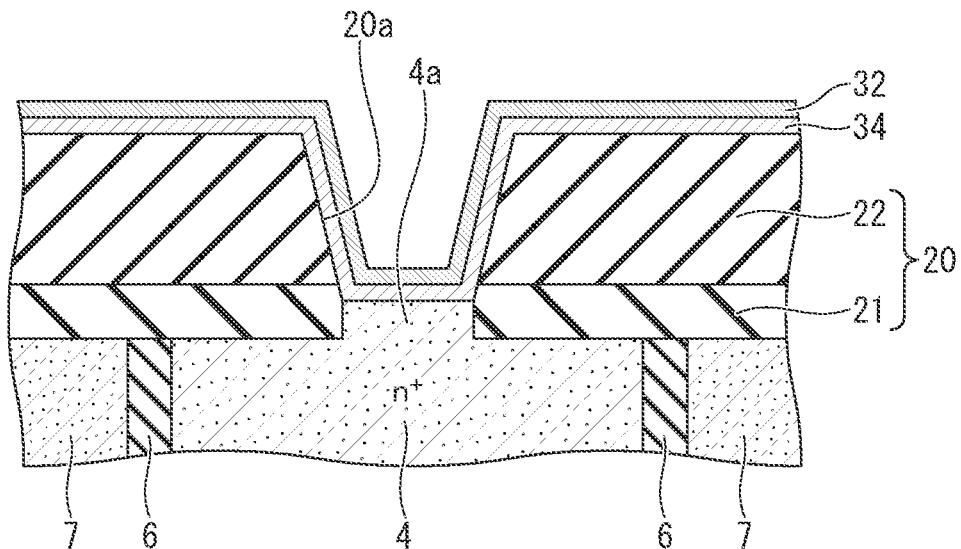
FIG. 19 is a cross-sectional view for explaining a method of manufacturing a semiconductor device according to a second modified example of the first embodiment.

A method of manufacturing a semiconductor device according to a second modified example of the first embodiment differs from the method of manufacturing the semiconductor device according to the first embodiment in sequentially forming the titanium film 34 and the titanium nitride film 32 before forming the titanium silicide layer 31, as illustrated in FIG. 19. The titanium film 34 located at the bottom of the contact hole 20a is subjected to silicidation after sequentially forming the titanium film 34 and the titanium nitride film 32 so as to form the titanium silicide layer 31. The other steps of the method of manufacturing the semiconductor device according to the second modified example of the first embodiment are the same as those of the method of manufacturing the semiconductor device according to the first embodiment.

Figure 20:
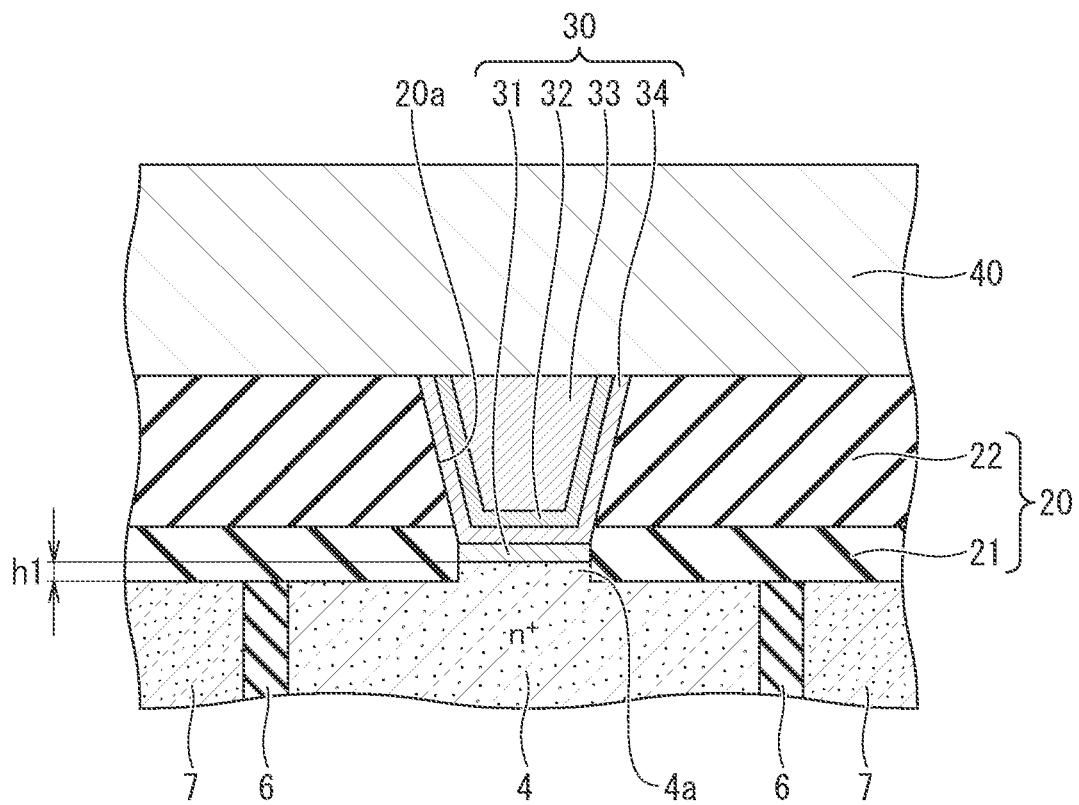
FIG. 20 is a cross-sectional view continued from FIG. 19 for explaining the method of manufacturing the semiconductor device according to the second modified example of the first embodiment.

This manufacturing method thus forms the connection conductor 30 including the titanium silicide layer 31, the titanium film 34, the titanium nitride film 32, and the tungsten film 33, as illustrated in FIG. 20. The titanium film 34 is interposed between the titanium silicide layer 31 and the titanium nitride film 32 so as to be in contact with the titanium silicide layer 31 and the titanium nitride film 32.

While FIG. 20 illustrates the case in which the titanium film 34 located on the top surface of the titanium silicide layer 31 is not all silicided but partly remains, all of the titanium film 34 located on the top surface of the titanium silicide layer 31 may be silicided completely. In such a case, the top surface of the titanium silicide layer 31 is in contact with the titanium nitride film 32, while the titanium film 34 remains on the side surface of the contact hole 20a. The titanium film 34 and the titanium nitride film 32 on the interlayer insulating film 20 are not necessarily removed.

The method of manufacturing the semiconductor device according to the second modified example of the first embodiment, which sequentially forms the titanium film 34 and the titanium nitride film 32 before forming the titanium silicide layer 31, can prevent the titanium nitride film 32 from being greatly dragged downward upon the formation of the titanium silicide layer 31 since the projection 4a is preliminarily formed, so as to avoid breakage of the titanium nitride film 32. The second modified example thus can form the titanium nitride film 32 and the tungsten film 33 favorably as in the case of the first embodiment.

Third Modified Example

Figure 21:
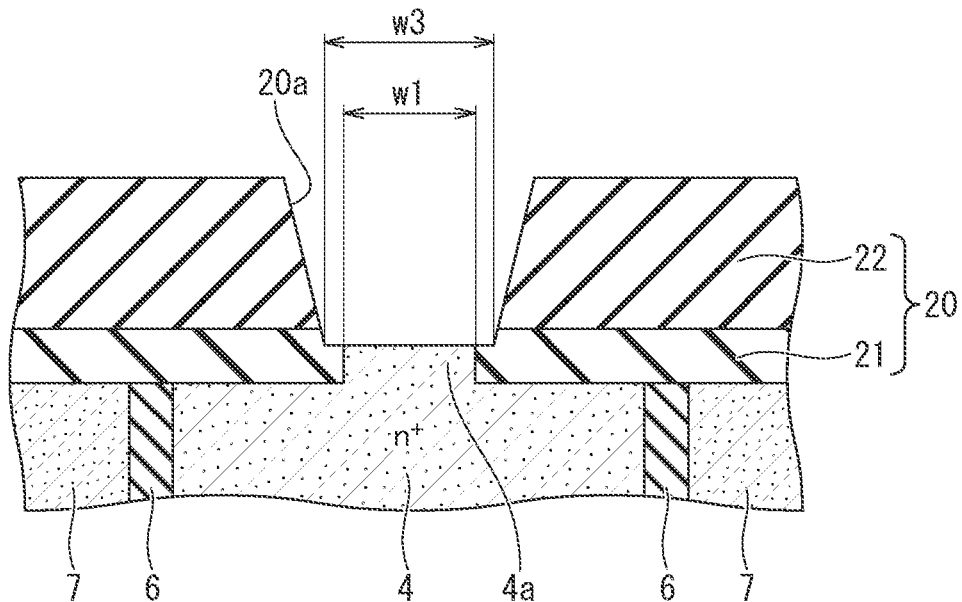
FIG. 21 is a cross-sectional view for explaining a method of manufacturing a semiconductor device according to a third modified example of the first embodiment.
Figure 22:
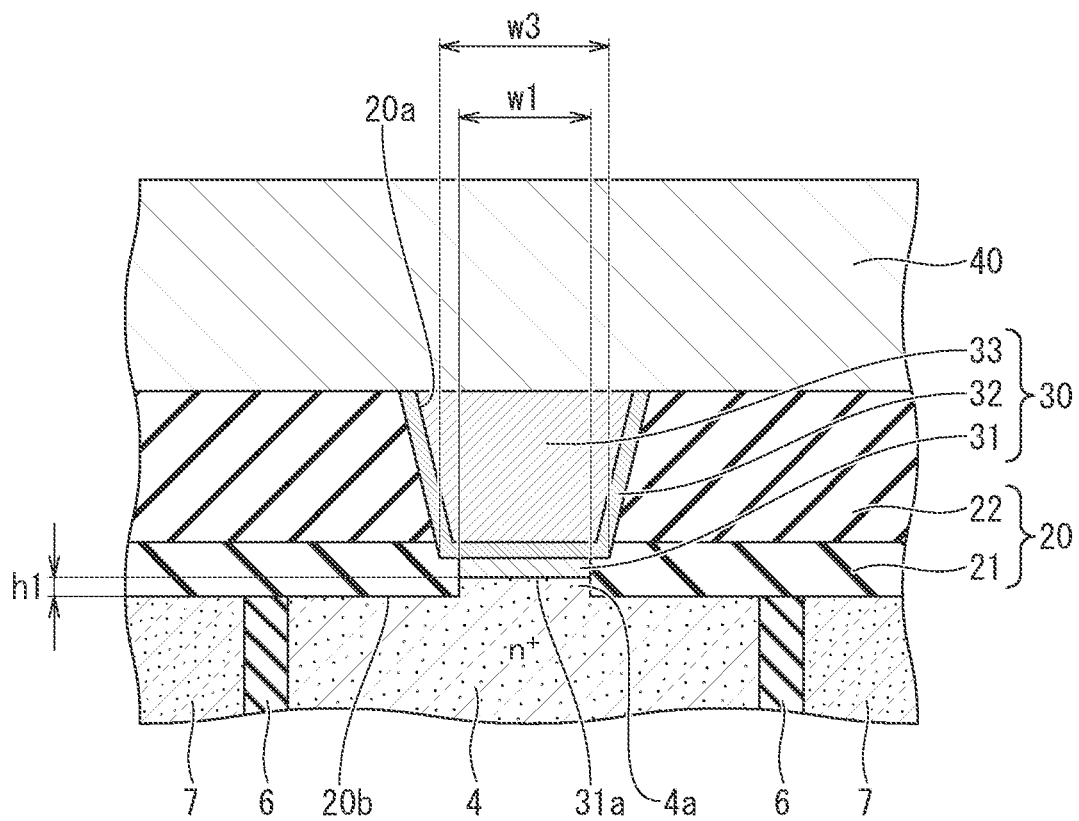
FIG. 22 is a cross-sectional view continued from FIG. 21 for explaining the method of manufacturing the semiconductor device according to the third modified example of the first embodiment.

A method of manufacturing a semiconductor device according to a third modified example of the first embodiment differs from the method of manufacturing the semiconductor device according to the first embodiment in defining the width w3 of the bottom surface of the contact hole 20a of the interlayer insulating film 20 to be greater than the width w1 of the projection 4a when opening the contact hole 20a, as illustrated in FIG. 21. The level of the bottom surface of the contact hole 20a conforms to the level of the top surface of the projection 4a. The other steps of the method of manufacturing the semiconductor device according to the third modified example of the first embodiment are the same as those of the method of manufacturing the semiconductor device according to the first embodiment. The width w3 of the titanium nitride film 32 located at the bottom of the contact hole 20a is thus greater than the width w1 of the titanium silicide layer 31, as illustrated in FIG. 22.

The method of manufacturing the semiconductor device according to the third modified example of the first embodiment, which defines the width w3 of the bottom surface of the contact hole 20a to be greater than the width w1 of the projection 4a, can facilitate the exposure of the entire top surface of the projection 4a if the accuracy of the positioning of the contact hole 20a is low, for example The third modified example thus can form the titanium nitride film 32 and the tungsten film 33 favorably as in the case of the first embodiment.

Fourth Modified Example

Figure 23:
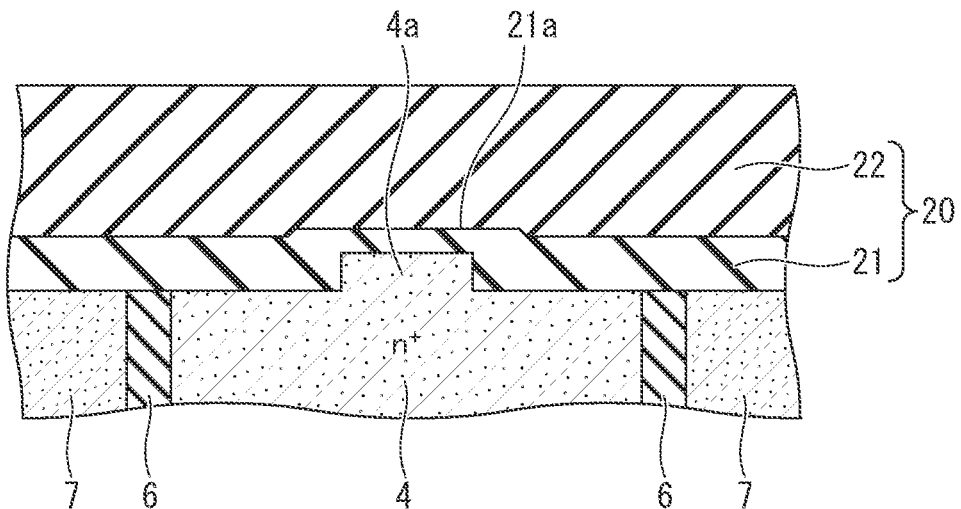
FIG. 23 is a cross-sectional view for explaining a method of manufacturing a semiconductor device according to a fourth modified example of the first embodiment.

A method of manufacturing a semiconductor device according to a fourth modified example of the first embodiment evens out the top surface of the first insulating film 21 by etching back or grinding, for example, after depositing the first insulating film 21, and then deposits the second insulating film 22 on the first insulating film 21, as illustrated in FIG. 23. While FIG. 23 illustrates the case in which the step 21a of the first insulating film 21 remains, the step 21a may be removed completely. Alternatively, the top surface of the first insulating film 21 may be further removed so as to lead the level of the top surface of the first insulating film 21 to substantially conform to the level of the top surface of the projection 4a. The position of the boundary between the first insulating film 21 and the second insulating film 22 may be led to approximate to the level of the top surface of the projection 4a when the second insulating film 22 is deposited so as to substantially conform to the level of the top surface of the projection 4a.

Figure 24:
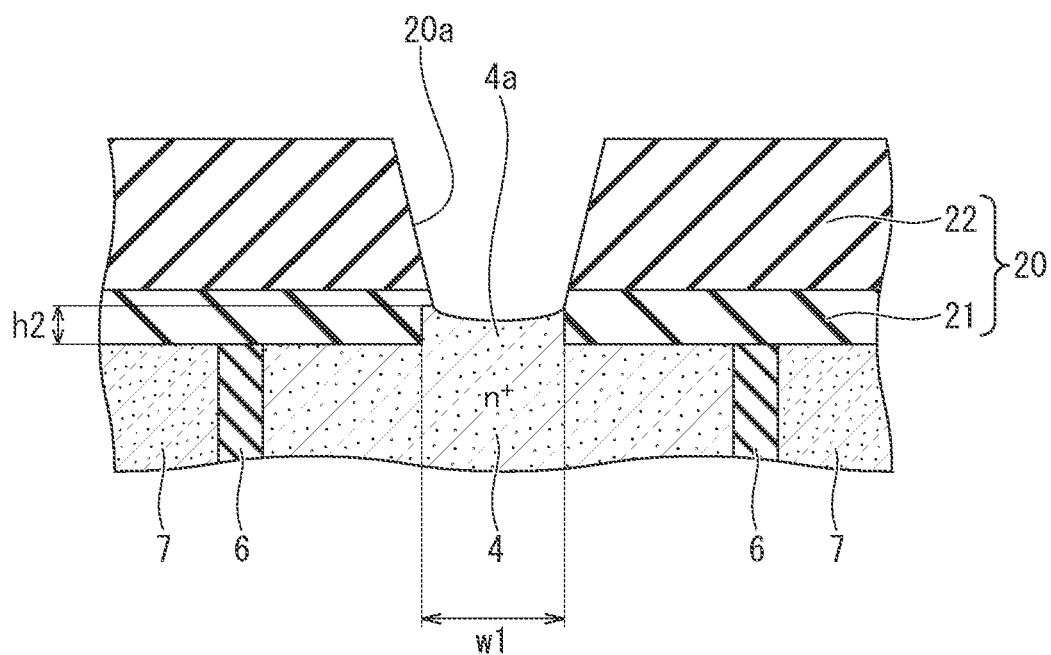
FIG. 24 is a cross-sectional view continued from FIG. 23 for explaining the method of manufacturing the semiconductor device according to the fourth modified example of the first embodiment.

Next, as illustrated in FIG. 24, the contact hole 20a is opened in the interlayer insulating film 20 by the CVD method, for example. FIG. 24 illustrates the case in which the position of the contact hole 20a is displaced so as to be provided with an under-etched part on the top surface of the projection 4a. The top surface of the projection 4a is not completely exposed but is partly covered by the interlayer insulating film 20.

Figure 25:
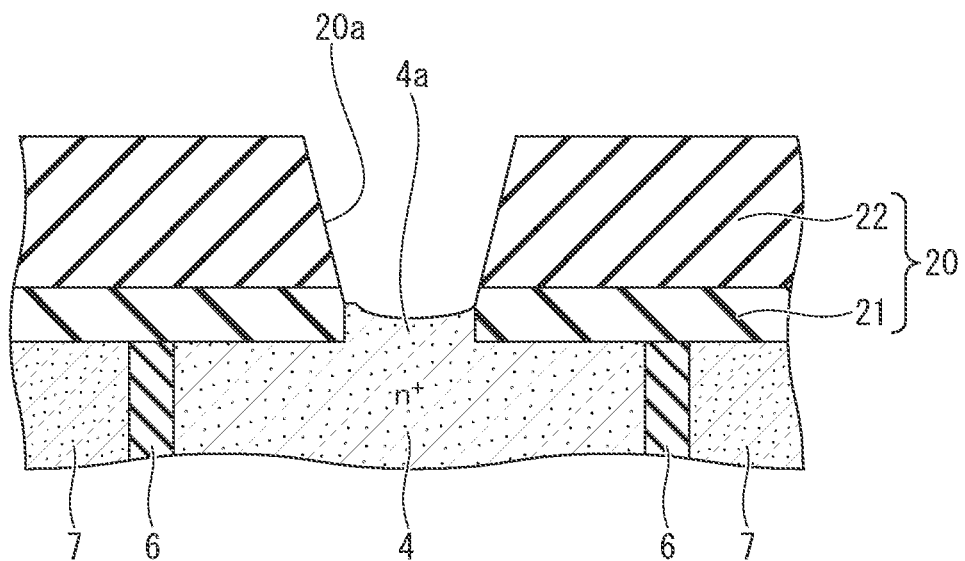
FIG. 25 is a cross-sectional view continued from FIG. 24 for explaining the method of manufacturing the semiconductor device according to the fourth modified example of the first embodiment.

Next, as illustrated in FIG. 25, a native oxide film on the mesa part is removed by hydrofluoric acid (HF). The top surface of the projection 4a can be exposed completely at this point by use of a difference of etch selectivity between the first insulating film 21 that is a HTO film and the HF of the second insulating film 22 that is a BPSG film, and by use of the spread of the etching in the lateral direction that is greater in the BPSG film than in the HTO film.

The method of manufacturing the semiconductor device according to the fourth modified example of the first embodiment can expose all of the top surface of the projection 4a by the removal of the native oxide film if the top surface of the projection 4a is not exposed completely when the contact hole 20a is opened, so as to form the titanium nitride film 32 and the tungsten film 33 favorably as in the case of the first embodiment. The manufacturing method according to the fourth modified example first evens out the top surface of the first insulating film 21 after being deposited and then deposits the second insulating film 22 on the first insulating film 21, so as to facilitate the exposure of the top surface of the projection 4a. The manufacturing method also forms the projection 4a to be higher than the maximum displaced width at the position of the contact hole 20a, so as to prevent the flat part other than the projection 4a in the mesa part from being exposed or dug downward.

Fifth Modified Example

Figure 26:
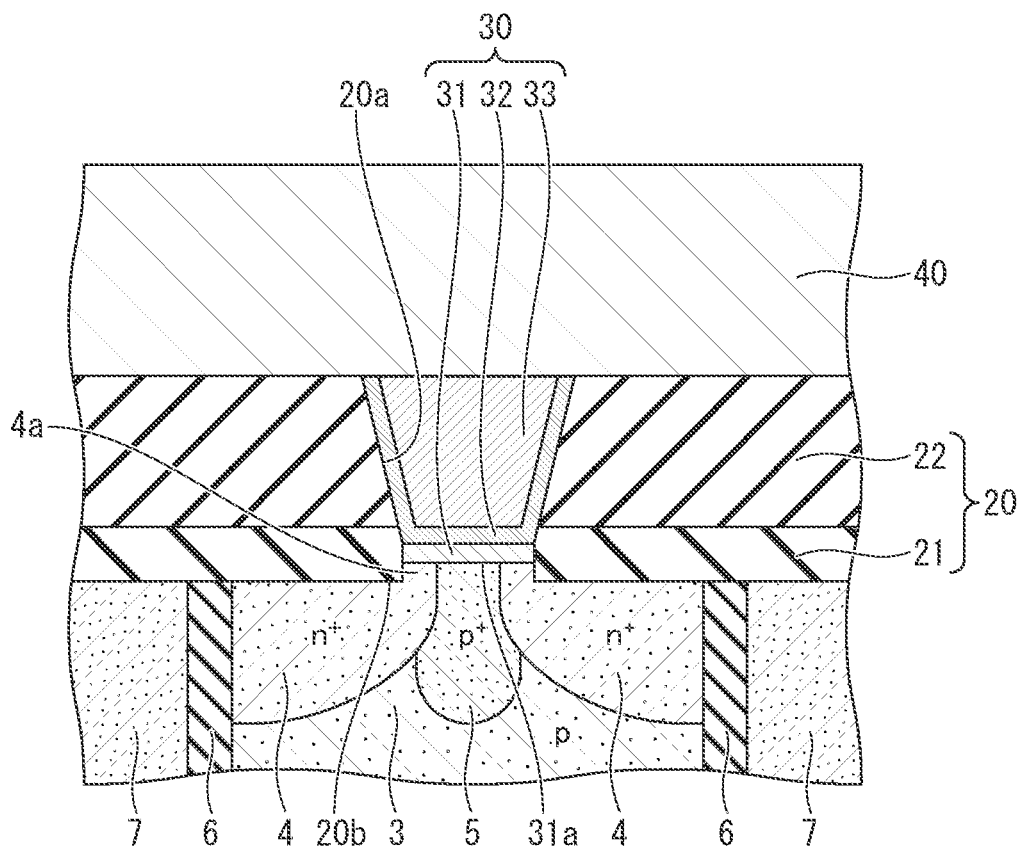
FIG. 26 is a cross-sectional view illustrating a semiconductor device according to a fifth modified example of the first embodiment.

A semiconductor device according to a fifth modified example of the first embodiment differs from the semiconductor device according to the first embodiment in that the n$^+$-type emitter region 4 and the p$^+$-type contact region 5 in the mesa part interposed between the trenches 11 adjacent to each other are aligned in the arranged direction of the plural trenches 11, as illustrated in FIG. 26. The emitter region 4 and the contact region 5 may each have a straight (stripe-shaped) part extending parallel to the extending direction of the respective trenches 11 in the planar pattern. The other configurations of the semiconductor device according to the fifth modified example of the first embodiment are the same as those of the semiconductor device according to the first embodiment, and overlapping explanations are not repeated below.

The semiconductor device according to the fifth modified example of the first embodiment, in which the n$^+$-type emitter region 4 and the p$^+$-type contact region 5 in the mesa part interposed between the trenches 11 adjacent to each other are aligned in the arranged direction of the trenches 11, can also form the titanium nitride film 32 and the tungsten film 33 favorably as in the case of the first embodiment.

Second Embodiment

<Configuration of Semiconductor Device>

Figure 27:
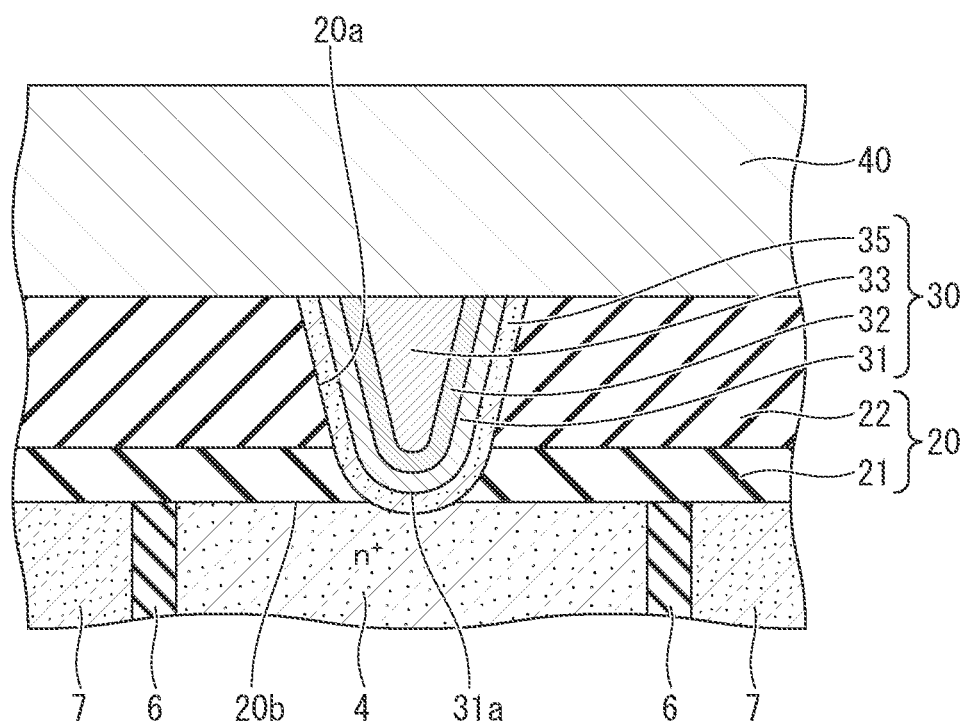
FIG. 27 is a cross-sectional view illustrating an example of a semiconductor device according to a second embodiment.

A fundamental configuration of a semiconductor device according to a second embodiment is substantially the same as that of the semiconductor device according to the first embodiment illustrated in FIG. 1 and FIG. 2. FIG. 27 is a cross-sectional view illustrating the semiconductor device according to the second embodiment corresponding to the cross section of the semiconductor device according to the first embodiment illustrated in FIG. 3. As illustrated in FIG. 27, the semiconductor device according to the second embodiment differs from the semiconductor device according to the first embodiment in the structure around the connection conductor 30.

As illustrated in FIG. 27, the emitter region 4 is provided in the mesa part interposed between the trenches 11 adjacent to each other. The emitter region 4 is not provided with the projection at the upper part. The bottom surface of the contact hole 20a has a shape convex toward the upper part of the emitter region 4. The bottom surface of the contact hole 20a may conform to the top surface of the emitter region 4.

The connection conductor 30 is buried in the contact hole 20a. The connection conductor 30 includes a silicon film 35 including silicon (Si) such as polysilicon with which p-type impurity ions or n-type impurity ions are heavily doped, the titanium silicide layer 31 that is a silicide layer including titanium silicide (TiSi$_2$), the titanium nitride film 32 that is a barrier metal film including titanium nitride (TiN), and the tungsten film 33 that is a metal film including tungsten (W).

The silicon film 35 has a thickness set in a range of about 10 nanometers or greater and 80 nanometers or less, for example. The titanium silicide layer 31 has a thickness set in a range of about 20 nanometers or greater and 80 nanometers or less, for example. The titanium nitride film 32 has a thickness set in a range of about 20 nanometers or greater and 140 nanometers or less, for example. The tungsten film 33 has a thickness set in a range of about 100 nanometers or greater and 1500 nanometers or less, for example.

The silicon film 35 is provided to cover the bottom surface and the side surface of the contact hole 20a. The silicon film 35 is in contact with the emitter region 4 located at the bottom of the contact hole 20a, and is in contact with the respective side surfaces of the first insulating film 21 and the second insulating film 22 exposed on the side surface of the contact hole 20a.

The titanium silicide layer 31 is provided to cover the bottom surface and the side surface of the contact hole 20a via the silicon film 35. The titanium silicide layer 31 is in contact with the silicon film 35. The lowermost part of the bottom surface (the bottom) 31a of the titanium silicide layer 31 is located at a higher position than the bottom surface 20b of the interlayer insulating film 20.

The titanium nitride film 32 is provided to cover the bottom surface and the side surface of the contact hole 20a via the silicon film 35 and the titanium silicide layer 31. The titanium nitride film 32 is in contact with the titanium silicide layer 31.

The tungsten film 33 is deposited in the contact hole 20a via the silicon film 35, the titanium silicide layer 31, and the titanium nitride film 32 so as to fill the contact hole 20a. The tungsten film 33 is in contact with the titanium nitride film 32. The other configurations of the semiconductor device according to the second embodiment are substantially the same as those of the semiconductor device according to the first embodiment, and overlapping explanations are not repeated below.

<Method of Manufacturing Semiconductor Device>

Figure 28:
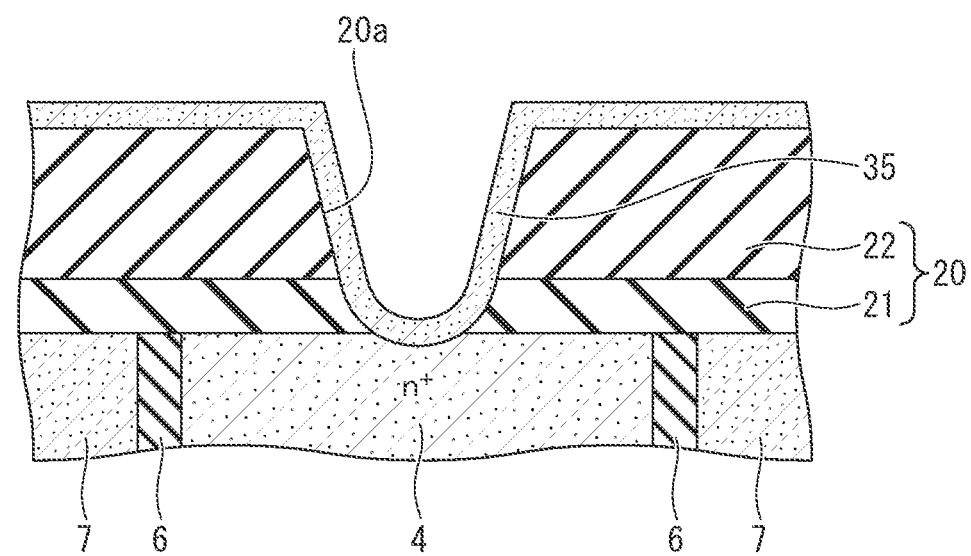
FIG. 28 is a cross-sectional view for explaining an example of a method of manufacturing the semiconductor device according to the second embodiment.
Figure 29:
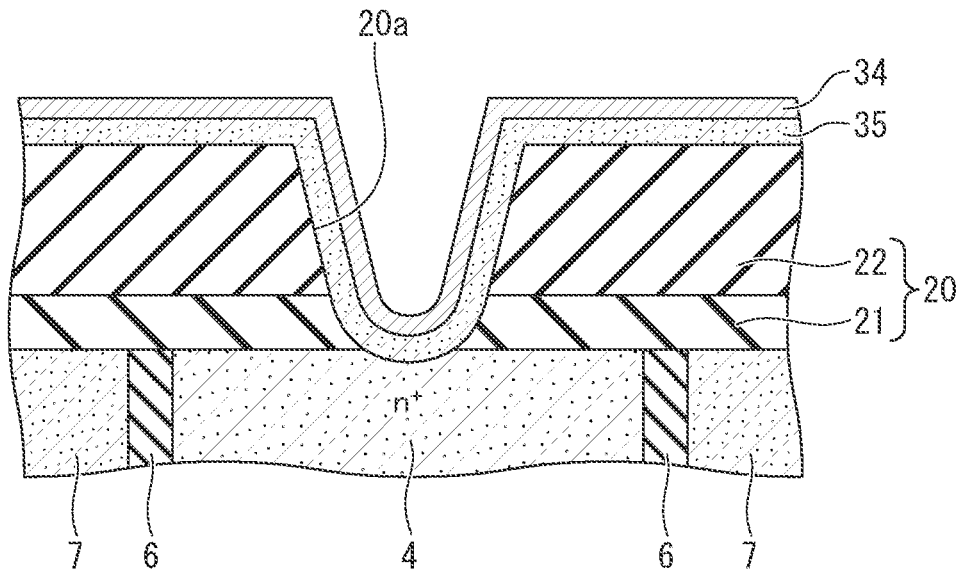
FIG. 29 is a cross-sectional view continued from FIG. 28 for explaining the example of the method of manufacturing the semiconductor device according to the second embodiment.
Figure 30:
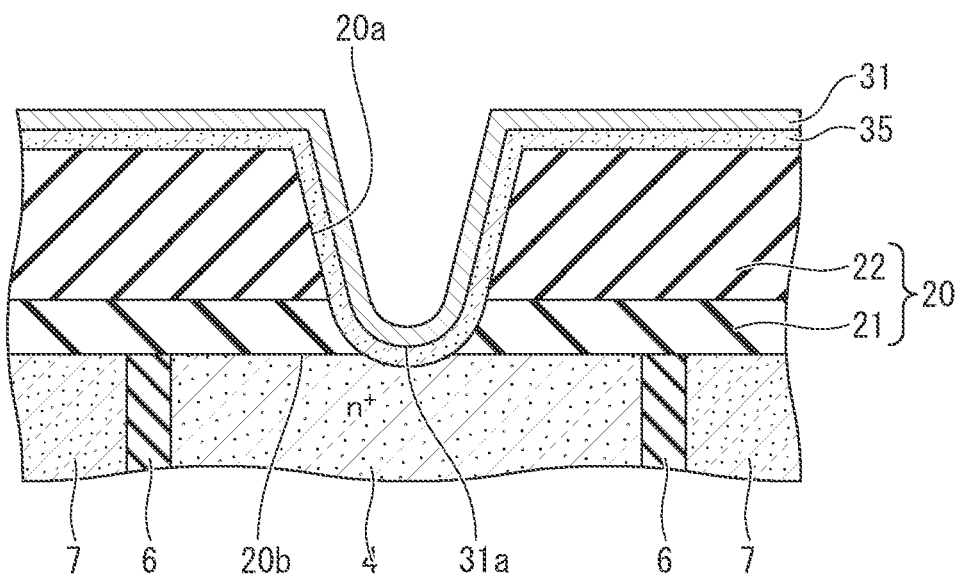
FIG. 30 is a cross-sectional view continued from FIG. 29 for explaining the example of the method of manufacturing the semiconductor device according to the second embodiment.

An example of a method of manufacturing the semiconductor device according to the second embodiment is described below with reference to FIG. 28 to FIG. 30. FIG. 28 to FIG. 30 are cross-sectional views each corresponding to FIG. 27. It should be understood that the method of manufacturing the semiconductor device described below is an example, and the semiconductor device can be manufactured by any other methods including modified examples of this embodiment within the scope of the appended claims.

The method of manufacturing the semiconductor device according to the second embodiment includes the same procedure as the method of manufacturing the semiconductor device according to the first embodiment by the step of forming the insulated gate electrode structures (6, 7) illustrated in FIG. 5. Next, the first insulating film 21 and the second insulating film 22 are sequentially deposited on the top surfaces of the respective insulated gate electrode structures (6, 7) and the emitter region 4 so as to form the interlayer insulating film 20 by the CVD method, for example, without the projection formed in the mesa part interposed between the trenches 11 adjacent to each other, as illustrated in FIG. 13.

Next, as illustrated in FIG. 14, the contact hole 20a is opened in the interlayer insulating film 20 by photolithography and dry etching so as to expose a part of the emitter region 4 to the contact hole 20a. While FIG. 14 illustrates the case in which the bottom surface of the contact hole 20a hollows out the upper part of the emitter region 4, the etching may be stopped immediately at the point of exposing the top surface of the emitter region 4.

Next, as illustrated in FIG. 28, the silicon film 35 of polysilicon with which p-type impurity ions or n-type impurity ions are heavily doped, for example, is deposited on the bottom surface and the side surface of the contact hole 20a and the top surface of the second insulating film 22 by the CVD method and the like. The top surface of the silicon film 35 located at the bottom of the contact hole 20a is located at a higher position than the bottom surface of the interlayer insulating film 20. The silicon film 35 located on the top surface of the second insulating film 22 may be selectively removed so as to lead the silicon film 35 to remain only in the contact hole 20a.

Next, the ion implantation and the annealing are executed so as to cause the part of the silicon film 35 in contact with the emitter region 4 to be an n-type region and cause the part of the silicon film 35 in contact with the contact region 5 to be a p-type region. For example, after the silicon film 35 with which the n-type impurity ions are heavily doped is deposited, p-type impurity ions such as boron (B) may be implanted and then activated by annealing to invert the conductivity type of the n-type region of the silicon film 35 in contact with the contact region 5 so as to selectively form the p-type region.

Next, as illustrated in FIG. 29, the titanium film 34 is deposited by sputtering or vapor deposition, for example. Next, the titanium film 34 and a part of the silicon film 35 are led to react with each other by heat treatment so as to form the titanium silicide layer 31 on the top surface side of the silicon film 35, as illustrated in FIG. 30. The silicon film 35 is not completely silicided but partly remains. The silicon film 35 covers the bottom and the side surface of the contact hole 20a, so as to prevent overhangs from being formed in the first insulating film 21 upon the formation of the titanium silicide layer 31.

While FIG. 30 illustrates the case in which the titanium film 34 is completely silicided, the titanium film 34 may be partly unreacted to remain. The unreacted titanium film 34 when remaining may be removed.

Next, the titanium nitride film 32 is formed on the titanium silicide layer 31 by sputtering or vapor deposition, for example. The tungsten film 33 is further deposited on the titanium nitride film 32 by the CVD method and the like so as to fill the contact hole 20a. The titanium nitride film 32 and the tungsten film 33 located on the top surface of the second insulating film 22 are then selectively removed. These steps provide the connection conductor 30 in the contact hole 20a including the silicon film 35, the titanium silicide layer 31, the titanium nitride film 32, and the tungsten film 33.

Next, as illustrated in FIG. 27, the front-surface electrode 40 is deposited on the top surface of the second insulating film 22 and the top surface of the connection conductor 30 by sputtering or vapor deposition, for example. The following steps are the same as those in the method of manufacturing the semiconductor device according to the first embodiment, and overlapping explanations are not repeated below. The semiconductor device according to the second embodiment is thus completed by the method described above.

The method of manufacturing the semiconductor device according to the second embodiment deposits the silicon film 35 after opening the contact hole 20a as illustrated in FIG. 28. This can avoid the provision of eaves in the first insulating film 21 upon the formation of the titanium silicide layer 31, as illustrated in FIG. 29. The manufacturing method according to the second embodiment thus can form the titanium nitride film 32 and the tungsten film 33 favorably after the formation of the titanium silicide layer 31, so as to prevent a spread of tungsten (W) of the tungsten film 33 toward silicon (Si) in the mesa part.

In addition, the method of manufacturing the semiconductor device according to the second embodiment, which removes the unreacted titanium film 34 after the formation of the titanium silicide layer 31, can lead the hydrogen during the annealing to sufficiently reach the gate insulating film 6 without being absorbed to the titanium film 34, as in the case of the method of manufacturing the semiconductor device according to the first embodiment.

The method of manufacturing the semiconductor device according to the second embodiment may subject the titanium film 34 to silicidation to form the titanium silicide layer 31 after sequentially depositing the titanium film 34 and the titanium nitride film 32, instead of the step of depositing the titanium nitride film 32 after subjecting the titanium film 34 to silicidation to form the titanium silicide layer 31. This case can also prevent the titanium nitride film 32 from being greatly dragged downward upon the formation of the titanium silicide layer 31, so as to avoid breakage of the titanium nitride film 32.

The method of manufacturing the semiconductor device according to the second embodiment may deposit the silicon film 35 to cover the top surface of the projection 4a after forming the projection 4a in the mesa part as illustrated in FIG. 6 and then opening the contact hole 20a so as to expose the top surface of the projection 4a as illustrated in FIG. 8 through the same steps as in the method of manufacturing the semiconductor device according to the first embodiment. This case can also form the titanium nitride film 32 and the tungsten film 33 favorably as in the case of the first embodiment.

Other Embodiments

As described above, the invention has been described according to the first and second embodiments, but it should not be understood that the description and drawings implementing a portion of this disclosure limit the invention. Various alternative embodiments of the present invention, examples, and operational techniques will be apparent to those skilled in the art from this disclosure.

While the first and second embodiments have been illustrated above with the semiconductor device that is the RC-IGBT, the present invention can also be applied to other IGBTs other than the RC-IGBT. The present invention can also be applied to a MOSFET using a drain region of $n^+$-type, instead of the $p^+$-type collector region 9 that is the IGBT in the transistor 10 illustrated in FIG. 2.

While the first and second embodiments have been illustrated above with the case of using the titanium silicide layer 31, the present invention may be applied to a case of using a silicide layer including a compound of metal, such as nickel (Ni), tungsten (W), cobalt (Co), molybdenum (Mo), zinc (Zn), hafnium (Hf), platinum (Pt), palladium (Pd), iron (Fe), chromium (Cr), tantalum (Ta), and niobium (Nb), and silicon, instead of the titanium silicide layer 31. In addition, the first and second embodiments have been illustrated above with the case of using the titanium nitride film 32 as a barrier metal film, the present invention may be applied to a case of using a barrier metal film of titanium-tungsten (TiW) or tantalum nitride (TaN), for example. Further, the first and second embodiments have been illustrated above with the case of using the tungsten film 33 as a buried metal film, the present invention may be applied to a case of using a metal film of aluminum (Al) or copper (Cu), for example, instead of the tungsten film 33.

The respective configurations disclosed in the first and second embodiments of the present invention and the respective modified examples can be combined together as necessary within a range without contradicting each other. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

The invention claimed is:

1. A semiconductor device comprising:
   a semiconductor substrate;
   a plurality of trenches provided on a top surface side of the semiconductor substrate;
   an insulated gate electrode structure buried inside the respective trenches;
   an interlayer insulating film deposited on top surfaces of the semiconductor substrate and the insulated gate electrode structure; and
   a silicide layer deposited at a bottom of a contact hole penetrating the interlayer insulating film so as to be in contact with the top surface of the semiconductor substrate interposed between the trenches adjacent to each other,
   wherein at least a part of a bottom surface of the silicide layer is located at a higher position than a bottom surface of the interlayer insulating film.

2. The semiconductor device of claim 1, wherein the silicide layer is a titanium silicide layer.

3. The semiconductor device of claim 1, further comprising a life-time control region provided inside the semiconductor substrate.

4. The semiconductor device of claim 1, further comprising a titanium nitride film deposited on a top surface of the silicide layer and a side surface of the contact hole so as to be in contact with the top surface of the silicide layer.

5. The semiconductor device of claim 4, further comprising a tungsten film buried inside the contact hole via the titanium nitride film.

6. The semiconductor device of claim 1, wherein a width of the silicide layer is narrower than a width of a bottom surface of the contact hole.

7. The semiconductor device of claim 1, being a reverse-conducting insulated gate bipolar transistor comprising:
   a transistor part provided in a part of the semiconductor substrate; and
   a diode part provided in another part of the semiconductor substrate.

8. A method of manufacturing a semiconductor substrate, comprising:
   digging a plurality of trenches from a top surface side of a semiconductor substrate;
   burying an insulated gate electrode structure in the respective trenches;
   depositing an interlayer insulating film on top surfaces of the semiconductor substrate and the insulated gate electrode structure;
   forming a contact hole in the interlayer insulating film located on the semiconductor substrate interposed between the respective trenches; and
   forming a silicide layer inside the contact hole such that at least a part of a bottom surface of the silicide layer is located at a higher position than a bottom surface of the interlayer insulating film.

9. The method of manufacturing the semiconductor substrate of claim 8, wherein the silicide layer is a titanium silicide layer.

10. The method of manufacturing the semiconductor substrate of claim 8, wherein:
    the burying the insulated gate electrode structure comprises forming a projection at an upper part of the semiconductor substrate interposed between the trenches adjacent to each other;
    the forming the contact hole forms the contact hole such that an upper part of the projection is exposed to the contact hole;
    the forming the silicide layer forms the silicide layer by depositing a titanium film on a top surface of the projection and leading the titanium film and a part of the projection to react with each other by heat treatment so as to.

11. The method of manufacturing the semiconductor substrate of claim 10, wherein a width of a bottom surface of the contact hole is defined to be greater than a width of the projection.

12. The method of manufacturing the semiconductor substrate of claim 10, further comprising removing the titanium film not reacted after forming the silicide layer.

13. The method of manufacturing the semiconductor substrate of claim 10, wherein the forming the silicide layer deposits a titanium nitride film after depositing the titanium film and before forming the silicide layer.

14. The method of manufacturing the semiconductor substrate of claim 13, further comprising filling the contact hole with a tungsten film via the titanium nitride film after forming the titanium nitride film.

15. The method of manufacturing the semiconductor substrate of claim 14, further comprising radiating a particle beam toward the semiconductor substrate.

16. The method of manufacturing the semiconductor substrate of claim 15, further comprising executing annealing after radiating the particle beam.

17. The method of manufacturing the semiconductor substrate of claim 10, further comprising forming a titanium nitride film so as to be in contact with a top surface of the silicide layer after forming the silicide layer.

18. The method of manufacturing the semiconductor substrate of claim 8, wherein the forming the silicide layer comprises:
    depositing a silicon film and a titanium film inside the contact hole; and
    leading the titanium film and at least a part of the silicon film to react with each other by heat treatment so as to form the silicide layer.

* * * * *